(12) United States Patent
Parekh et al.

(10) Patent No.: US 11,282,815 B2
(45) Date of Patent: Mar. 22, 2022

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventors: Kunal R. Parekh, Boise, ID (US); Paolo Tessariol, Arcore (IT); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/742,485

(22) Filed: Jan. 14, 2020

(65) Prior Publication Data

US 2021/0217730 A1 Jul. 15, 2021

(51) Int. Cl.
*H01L 25/065* (2006.01)
*H01L 23/48* (2006.01)
(Continued)

(52) U.S. Cl.
CPC ........ *H01L 25/0657* (2013.01); *H01L 21/768* (2013.01); *H01L 23/481* (2013.01);
(Continued)

(58) Field of Classification Search
CPC ..................................................... H01L 25/18
See application file for complete search history.

(56) References Cited

U.S. PATENT DOCUMENTS

| 4,925,809 | A  | 5/1990 | Yoshiharu et al. |
| 7,372,091 | B2 | 5/2008 | Leslie |

(Continued)

FOREIGN PATENT DOCUMENTS

| JP | 2002-103299 A | 4/2002 |
| KR | 10-2009-0034570 A | 4/2009 |

(Continued)

OTHER PUBLICATIONS

Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.
(Continued)

*Primary Examiner* — William A Harriston
(74) *Attorney, Agent, or Firm* — TraskBritt

(57) ABSTRACT

A microelectronic device comprises a memory array region, a control logic region, and an additional control logic region. The memory array region comprises a stack structure comprising vertically alternating conductive structures and insulating structures, and vertically extending strings of memory cells within the stack structure. The control logic region underlies the stack structure and comprises control logic devices configured to effectuate a portion of control operations for the vertically extending strings of memory cells. The additional control logic region overlies the stack structure and comprises additional control logic devices configured to effectuate an additional portion of the control operations for the vertically extending strings of memory cells. Methods of forming a microelectronic device, and additional microelectronic devices and electronic systems are also described.

11 Claims, 9 Drawing Sheets

(51) Int. Cl.
  *H01L 21/768* (2006.01)
  *H01L 23/482* (2006.01)
  *H01L 23/00* (2006.01)
  *H01L 25/00* (2006.01)
(52) U.S. Cl.
  CPC .......... *H01L 23/4827* (2013.01); *H01L 24/05* (2013.01); *H01L 25/50* (2013.01)

(56) References Cited

U.S. PATENT DOCUMENTS

| | | | |
|---|---|---|---|
| 7,897,485 | B2 | 3/2011 | Parekh |
| 8,042,082 | B2 | 10/2011 | Neal |
| 8,958,228 | B2 | 2/2015 | Samazhisa et al. |
| 9,196,753 | B2 | 11/2015 | Ramaswamy et al. |
| 9,397,145 | B1 | 7/2016 | Sills et al. |
| 9,449,652 | B2 | 9/2016 | Werner |
| 9,515,083 | B2 | 12/2016 | Lee et al. |
| 9,530,790 | B1 | 12/2016 | Lu et al. |
| 9,553,263 | B1 | 1/2017 | Petz et al. |
| 9,590,012 | B2 | 3/2017 | Lee et al. |
| 9,653,617 | B2 | 5/2017 | Zhou et al. |
| 9,922,716 | B2 | 3/2018 | Hsiung et al. |
| 10,283,703 | B2 | 5/2019 | Pellizzer et al. |
| 10,381,362 | B1 | 8/2019 | Cui et al. |
| 10,665,580 | B1 | 5/2020 | Hosoda et al. |
| 10,847,220 | B2 | 11/2020 | Castro |
| 2003/0113669 | A1 | 6/2003 | Cheng et al. |
| 2006/0076690 | A1 | 4/2006 | Khandros et al. |
| 2007/0288702 | A1 | 12/2007 | Roohparvar |
| 2009/0168482 | A1 | 7/2009 | Park et al. |
| 2013/0130468 | A1 | 5/2013 | Higashitani et al. |
| 2014/0124726 | A1 | 5/2014 | Oh |
| 2014/0175637 | A1 | 6/2014 | Stuber et al. |
| 2015/0243708 | A1 | 8/2015 | Ravasio et al. |
| 2016/0104715 | A1 | 4/2016 | Pachamuthu et al. |
| 2016/0268304 | A1 | 9/2016 | Ikeda et al. |
| 2016/0343727 | A1 | 11/2016 | Kim et al. |
| 2017/0054036 | A1 | 2/2017 | Dorhout et al. |
| 2018/0158689 | A1 | 6/2018 | Mumford |
| 2019/0043836 | A1 | 2/2019 | Fastow et al. |
| 2019/0096906 | A1 | 3/2019 | Lindsay et al. |
| 2019/0206861 | A1 | 7/2019 | Beigel et al. |
| 2019/0221557 | A1* | 7/2019 | Kim ................... H01L 25/50 |
| 2020/0013792 | A1 | 1/2020 | Parekh et al. |
| 2020/0013798 | A1 | 1/2020 | Parekh |
| 2020/0135541 | A1 | 4/2020 | Wu et al. |
| 2020/0227397 | A1 | 7/2020 | Yada et al. |

FOREIGN PATENT DOCUMENTS

| | | |
|---|---|---|
| KR | 10-2015-0085155 A | 7/2015 |
| KR | 10-2020-0008606 A | 1/2020 |
| KR | 10-2020-0037444 A | 4/2020 |
| TW | 201946057 A | 12/2019 |
| WO | 2008/063251 A2 | 5/2008 |

OTHER PUBLICATIONS

Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.

YMTC, About Xtacking, http://www.ymtc.com, visited Apr. 20, 2020, 3 pages.

Micron, Introducing 2nd Generation Micron Mobile TLC 3D NAND, Industry-Leading Storage Solutions for Flagship Smartphones, (2018), 9 pages.

YMTC, About Xtacking, Xtacking Enables Dram-Like High I/O Speed, www.ymtc.com/Index.php?s=/cms/cate/69.html, (Apr. 20, 2020), 3 pages.

International Search Report for Application No. PCT/US2020/065681, dated Apr. 19, 2021, 5 pages.

Written Opinion of the International Searching Authority for Application No. PCT/US2020/065681, dated Apr. 19, 2021, 7 pages.

* cited by examiner

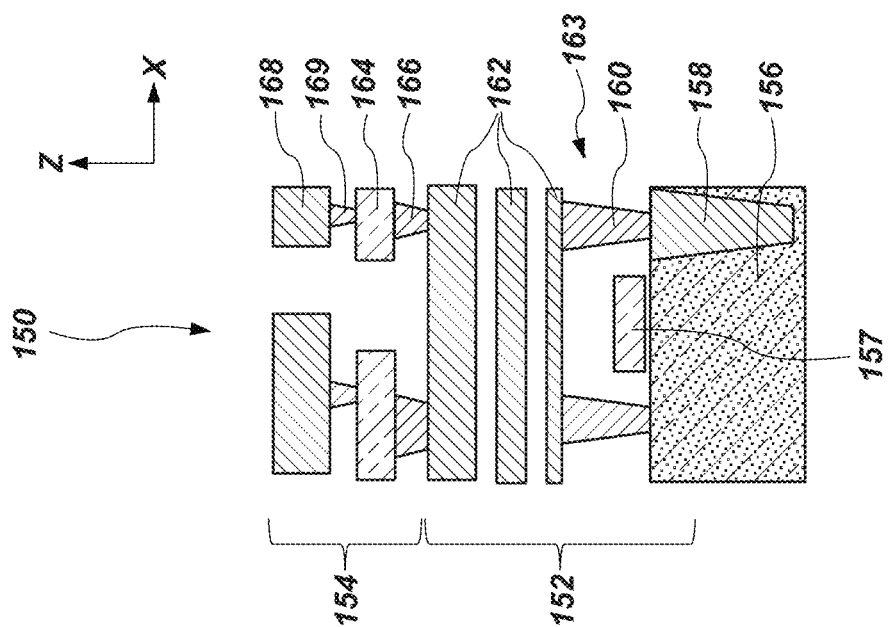
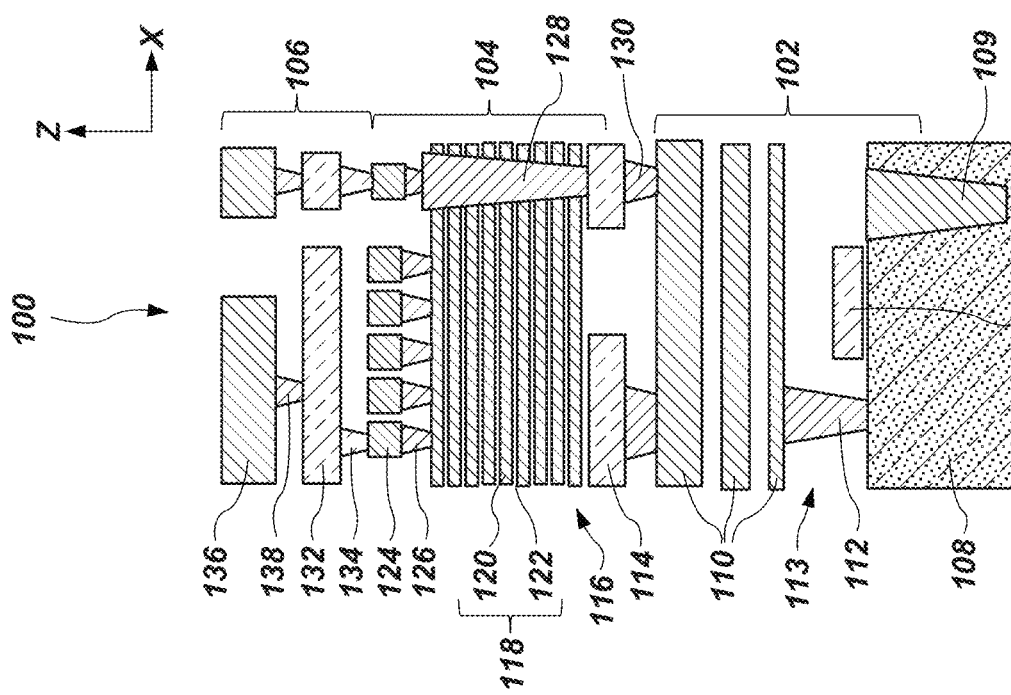

METHODS OF FORMING MICROELECTRONIC DEVICES, AND RELATED MICROELECTRONIC DEVICES AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device.

A need, therefore, exists for new methods of forming microelectronic devices (e.g., memory devices, such as NAND Flash memory devices), as well as for new microelectronic devices and electronic systems.

BRIEF DESCRIPTION OF THE DRAWINGS

FIGS. 1A through 1D are simplified, partial cross-sectional views illustrating a method of forming a microelectronic device, in accordance with embodiments of the disclosure.

DETAILED DESCRIPTION

Figure 1D:
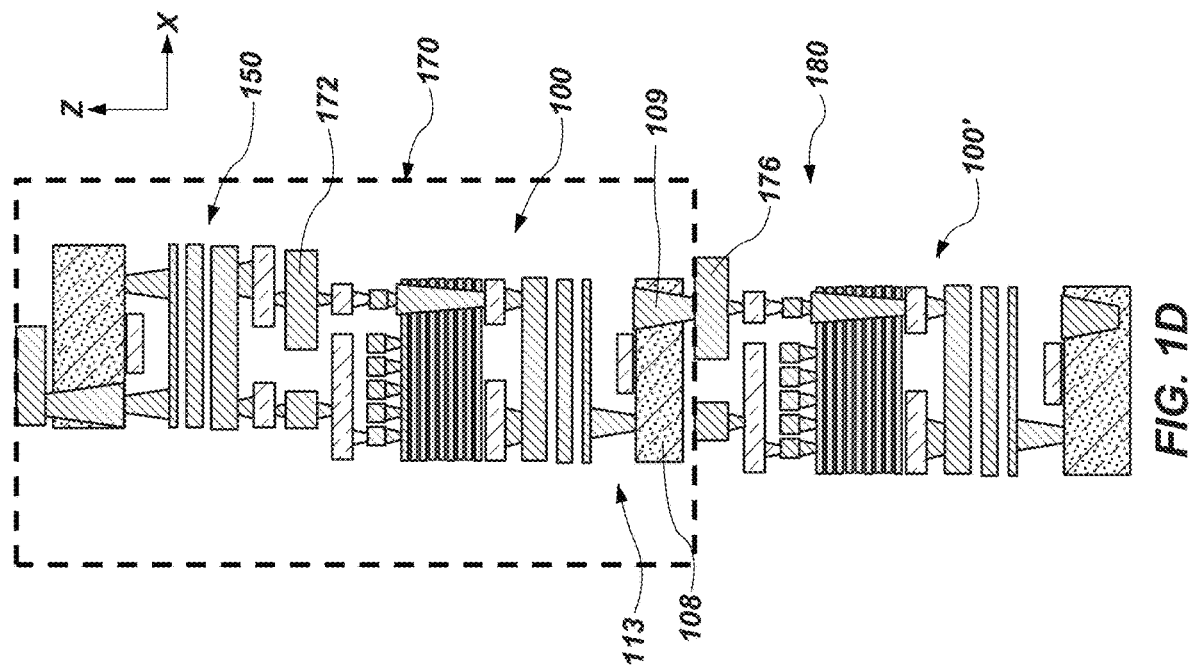

The following description provides specific details, such as material compositions and processing conditions (e.g., temperatures, pressures, flow rates, etc.) in order to provide a thorough description of embodiments of the disclosure. However, a person of ordinary skill in the art will understand that the embodiments of the disclosure may be practiced without necessarily employing these specific details. Indeed, the embodiments of the disclosure may be practiced in conjunction with conventional systems and methods employed in the industry. In addition, only those process components and acts necessary to understand the embodiments of the present disclosure are described in detail below. A person of ordinary skill in the art will understand that some process components (e.g., pipelines, line filters, valves, temperature detectors, flow detectors, pressure detectors, and the like) are inherently disclosed herein and that adding various conventional process components and acts would be in accord with the disclosure. Moreover, the description provided below does not form a complete process flow for manufacturing a microelectronic device. The structures described below do not form a complete microelectronic device. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

FIGS. 1A through 1D are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein with reference to FIGS. 1A through 1D may be used in various devices and electronic systems.

Referring to FIG. 1A, a first microelectronic device structure 100 (e.g., a first die) may be formed to include first control logic region 102, a memory array region 104 vertically over (e.g., in the Z-direction) and in electrical communication with the first control logic region 102, and an first interconnect region 106 vertically over and in electrical communication with the memory array region 104. Put another way, the memory array region 104 may be vertically interposed between and in electrical communication with the first control logic region 102 and the first interconnect region 106. The first control logic region 102 and the first interconnect region 106 may be at least partially (e.g., substantially) horizontally positioned (e.g., in the X-direction and another horizontal direction orthogonal to the X-direction) within horizontal boundaries of the memory array region 104 of the first microelectronic device structure 100.

The first control logic region 102 of the first microelectronic device structure 100 includes a first semiconductive base structure 108, first gate structures 111, first routing structures 110, and first interconnect structures 112. Portions of the first semiconductive base structure 108, the first gate structures 111, the first routing structures 110, and the first interconnect structures 112 form various first control logic devices 113 of the first control logic region 102, as described in further detail below.

The first semiconductive base structure 108 (e.g., first semiconductive wafer) of the first control logic region 102 comprises a base material or construction upon which additional materials and structures of the first microelectronic device structure 100 are formed. The first semiconductive base structure 108 may comprise a semiconductive structure (e.g., a semiconductive wafer), or a base semiconductive material on a supporting structure. For example, the first semiconductive base structure 108 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first semiconductive base structure 108 comprises a silicon wafer. In addition, the first semiconductive base structure 108 may include different layers, structures, and/or regions formed therein and/or thereon. For example, the first semiconductive base structure 108 may include conductively doped regions and undoped regions. The conductively doped regions may, for example, be employed as source regions and drain regions for transistors of the first control logic devices 113 of the first control logic region 102; and the undoped regions may, for example, be employed as channel regions for the transistors of the first control logic devices 113.

As shown in FIG. 1A, the first semiconductive base structure 108 may, optionally, further include one or more filled vias 109 (e.g., filled through-silicon vias (TSVs)) at least partially (e.g., less than completely, completely) vertically extending therethrough. If present, the filled via(s) 109 may be at least partially (e.g., substantially) filled with conductive material. The filled via(s) 109 may be employed to facilitate electrical connection between one or more components of the first microelectronic device structure 100 at a first side (e.g., a front side, a top side) of the first semiconductive base structure 108 and additional components (e.g., one or more structures and/or devices) to be provided at a second, opposing side (e.g., a back side, a bottom side) of the first semiconductive base structure 108, as described in further detail below. In additional embodiments, the filled via(s) 109 are omitted (e.g., absent) from the first semiconductive base structure 108.

With continued reference to FIG. 1A, the first gate structures 111 of the first control logic region 102 of the first microelectronic device structure 100 may vertically overlie portions of the first semiconductive base structure 108. The first gate structures 111 may individually horizontally extend between and be employed by transistors of the first control logic devices 113 within the first control logic region 102 of the first microelectronic device structure 100. The first gate structures 111 may be formed of and include conductive material. A gate dielectric material (e.g., a dielectric oxide) may vertically intervene (e.g., in the Z-direction) between the first gate structures 111 and channel regions (e.g., within the first semiconductive base structure 108) of the transistors.

As shown in FIG. 1A, the first routing structures 110 may vertically overlie (e.g., in the Z-direction) the first semiconductive base structure 108. The first routing structures 110 may be electrically connected to the first semiconductive base structure 108 by way of the first interconnect structures 112. Some of the first interconnect structures 112 may vertically extend between and electrically couple some of the first routing structures 110, and other of the first interconnect structures 112 may vertically extend between and electrically couple regions (e.g., conductively doped regions, such as source regions and drain regions) of the first semiconductive base structure 108 to one or more of the first routing structures 110. The first routing structures 110 and the first interconnect structures 112 may each individually be formed of and include conductive material.

As previously mentioned, portions of the first semiconductive base structure 108 (e.g., conductively doped regions serving as source regions and drain regions, undoped regions serving as channel regions), the first gate structures 111, the first routing structures 110, and the first interconnect structures 112 form various first control logic devices 113 of the first control logic region 102. The first control logic devices 113 may be configured to control various operations of other components of the first microelectronic device structure 100, such as components within the memory array region 104 of the first microelectronic device structure 100. The first control logic devices 113 included in the first control logic region 102 may be selected relative to additional control logic devices (e.g., second control logic devices) included in one or more additional control logic regions to be included an assembly including the first microelectronic device structure 100 and one or more additional microelectronic device structures, as described in further detail below. Configurations of the first control logic devices 113 included in the first control logic region 102 may be different than configuration of additional control logic devices included in the additional control logic region(s). In some embodiments, the additional control logic devices included in the additional control logic region(s) comprise relatively high performance control logic devices employing relatively high performance control logic circuitry (e.g., relatively high performance complementary metal oxide semiconductor (CMOS) circuitry); and the first control logic devices 113 included in the first control logic region 102 employ relatively lower performance control logic circuitry (e.g., additional CMOS circuitry). The additional control logic devices within the additional control logic region(s) may, for example, be configured to operate at applied voltages less than or equal to (e.g., less than) about 1.4 volts (V), such as within a range of from about 0.7 V to about 1.4 V (e.g., from about 0.7 V to about 1.3 V, from about 0.7 V to about 1.2 V, from about 0.9 V to about 1.2 V, from about 0.95 V to about 1.15 V, or about 1.1 V); and first control logic devices 113 within the first control logic region 102 may be configured to operate at applied voltages above upper operational voltages of additional control logic devices within the additional control logic regions(s), such as at applied voltages greater than about 1.2 V (e.g., greater than or equal to about 1.3 V, greater than or equal to about 1.4 V).

As a non-limiting example, the first control logic devices 113 included within the first control logic region 102 of the first microelectronic device structure 100 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, string drivers, page buffers, and various chip/deck control circuitry. As another non-limiting example, the first control logic devices 113 may include devices configured to control column operations for arrays (e.g., memory element array(s), access device array(s)) within the memory array region 104 of the first microelectronic device structure 100, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the first control logic devices 113 may include devices configured to control row operations for arrays (e.g., memory element array(s), access device array(s)) within the memory array region 104 of the first microelectronic device structure 100, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices.

The memory array region 104 of the first microelectronic device structure 100 may include a stack structure 116, line structures 124 (e.g., digit line structures, bit line structures), and line contact structures 126. As shown in FIG. 1A, the line structures 124 may vertically overlie (e.g., in the Z-direction) the stack structure 116, and may be electrically connected to structures (e.g., pillar structures, such as cell pillar structures; filled vias, such as through vias filled with conductive material) within the stack structure 116 by way of the line contact structures 126. The line contact structures 126 may vertically extend between and electrically couple individual line structures 124 and individual structures within the stack structure 116. The line structures 124 and the line contact structures 126 may each individually be formed of and include conductive material.

The stack structure 116 of the memory array region 104 includes a vertically alternating (e.g., in the Z-direction) sequence of conductive structures 120 and insulative structures 122 arranged in tiers 118. Each of the tiers 118 of the stack structure 116 may include at least one of the conductive structures 120 vertically neighboring at least one of the insulative structures 122. In some embodiments, the conductive structures 120 are formed of and include tungsten (W) and the insulative structures 122 are formed of and include silicon dioxide ($SiO_2$). The conductive structures 120 and insulative structures 122 of the tiers 118 of the stack structure 116 may each individually be substantially planar, and may each individually exhibit a desired thickness.

As shown in FIG. 1A, at least one deep contact structure 128 may vertically extend through the stack structure 116. The deep contact structure(s) 128 may be configured and positioned to electrically connect one or more components of the first microelectronic device structure 100 vertically overlying the stack structure 116 with one or more components of the first microelectronic device structure 100 vertically underlying the stack structure 116. The deep contact structure(s) 128 may be formed of and include conductive material.

The memory array region 104 further includes additional structures and/or devices on, over, and/or within the stack structure 116. As a non-limiting example, the memory array region 104 includes cell pillar structures vertically extending through the stack structure 116. The cell pillar structures may each individually include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures and the conductive structures 120 of the tiers 118 of the stack structure 116 may define vertically extending strings of memory cells coupled in series with one another within the memory array region 104 of the first microelectronic device structure 100. In some embodiments, the memory cells formed at the intersections of the conductive structures 120 and the cell pillar structures within each the tiers 118 of the stack structure 116 comprise so-called "MONOS" (metal-oxide-nitride-oxide-semiconductor) memory cells. In additional embodiments, the memory cells comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures and the conductive structures 120 of the different tiers 118 of the stack structure 116.

As shown in FIG. 1A, components of the memory array region 104 of the first microelectronic device structure 100 may be electrically connected to components (e.g., structures, such as the first routing structures 110; devices, such as the first control logic devices 113) of the first control logic region 102 of the first microelectronic device structure 100 by way of first pad structures 114 and second interconnect structures 130. For example, components (e.g., structures, devices) of the memory array region 104 may land on the first pad structures 114, and the second interconnect structures 130 may vertically extend between and electrically connect the first pad structures 114 and various components of the first control logic region 102. The first pad structures 114 and the second interconnect structures 130 may each individually be formed of and include conductive material.

With continued reference to FIG. 1A, the first interconnect region 106 of the first microelectronic device structure 100 may include second routing structures 132 and first bond pad structures 136. The second routing structures 132 may vertically overlie and be electrically connected to the line structures 124 of the memory array region 104, and the first bond pad structures 136 may vertically overlie and be electrically connected to the second routing structures 132. As shown in FIG. 1A, third interconnect structures 134 may vertically extend between and electrically connect the second routing structures 132 and the line structures 124, and fourth interconnect structures 138 may vertically extend between and electrically connect the second routing structures 132 and the first bond pad structures 136. The second routing structures 132, the third interconnect structures 134, the first bond pad structures 136, and the fourth interconnect structures 138 may each individually be formed of and include conductive material. In some embodiments, the second routing structures 132 are formed of and include Al, and the first bond pad structures 136 are formed of and include Cu.

Referring next to FIG. 1B, a second microelectronic device structure 150 (e.g., a chiplet) may be formed to include second control logic region 152, and a second interconnect region 154 vertically over and in electrical communication with the second control logic region 152. The second microelectronic device structure 150 may be configured to couple to the first microelectronic device structure 100, as described in further detail below.

The second control logic region 152 of the second microelectronic device structure 150 may include a second semiconductive base structure 156, second gate structures 157, third routing structures 162, and fifth interconnect structures 160. Portions of the second semiconductive base structure 156, the second gate structures 157, the third routing structures 162, and the fifth interconnect structures 160 form various second control logic devices 163 of the second control logic region 152, as described in further detail below.

The second semiconductive base structure 156 (e.g., second semiconductive wafer) of the second control logic region 152 comprises a base material or construction upon which additional materials and structures of the second microelectronic device structure 150 are formed. The second semiconductive base structure 156 may comprise a semiconductive structure (e.g., a semiconductive wafer), or a base semiconductive material on a supporting structure. For example, the second semiconductive base structure 156 may comprise a conventional silicon substrate (e.g., a conventional silicon wafer), or another bulk substrate comprising a semiconductive material. In some embodiments, the second semiconductive base structure 156 comprises a silicon wafer. In addition, the second semiconductive base structure 156 may include one or more layers, structures, and/or regions formed therein and/or thereon. For example, the second semiconductive base structure 156 may include conductively doped regions and undoped regions. The conductively doped regions may, for example, be employed as source regions and drain regions for transistors of the second control logic devices 163 of the second control logic region 152; and the undoped regions may, for example, be employed as channel regions for the transistors of the second control logic devices 163.

As shown in FIG. 1B, the second semiconductive base structure 156 may further include one or more additional filled vias 158 (e.g., additional filled TSVs) at least partially (e.g., less than completely, completely) vertically extending therethrough. The additional filled via(s) 158 may be at least partially (e.g., substantially) filled with conductive material. The additional filled via(s) 158 may be employed to facilitate electrical connection between one or more components of the second microelectronic device structure 150 at a first side (e.g., a front side, a top side) of the second semiconductive base structure 156 and additional components (e.g., one or more structures and/or devices) to be provided a second, opposing side (e.g., a back side, a bottom side) of the second semiconductive base structure 156, as described in further detail below.

With continued reference to FIG. 1B, the second gate structures 157 of the second control logic region 152 of the second microelectronic device structure 150 may vertically overlie portions of the second semiconductive base structure 156. The second gate structures 157 may individually horizontally extend between and be employed by transistors of the second control logic devices 163 within the second control logic region 152 of the second microelectronic device structure 150. The second gate structures 157 may be formed of and include conductive material. A gate dielectric material (e.g., a dielectric oxide) may vertically intervene (e.g., in the Z-direction) between the second gate structures 157 and channel regions (e.g., within the second semiconductive base structure 156) of the transistors.

As shown in FIG. 1B, the third routing structures 162 may vertically overlie (e.g., in the Z-direction) the second semiconductive base structure 156. The third routing structures 162 may be electrically connected to the second semiconductive base structure 156 by way of the fifth interconnect structures 160. Some of the fifth interconnect structures 160 may vertically extend between and electrically couple some of the third routing structures 162, and other of the fifth interconnect structures 160 may vertically extend between and electrically couple regions (e.g., conductively doped regions, such as source regions and drain regions) of the second semiconductive base structure 156 to one or more of the third routing structures 162. The third routing structures 162 and the fifth interconnect structures 160 may each individually be formed of and include conductive material.

As previously mentioned, portions of the second semiconductive base structure 156 (e.g., conductively doped regions serving as source regions and drain regions, undoped regions serving as channel regions), the second gate structures 157, the third routing structures 162, and the fifth interconnect structures 160 form various second control logic devices 163 of the second control logic region 152. The second control logic devices 163 may be configured to control various operations of other components of at least the first microelectronic device structure 100 (FIG. 1A), such as components within the memory array region 104 (FIG. 1A) of the first microelectronic device structure 100 (FIG. 1A). The second control logic devices 163 included in the second control logic region 152 may be selected relative to the first control logic devices 113 (FIG. 1A) included in at least the first control logic region 102 (FIG. 1A) of the first microelectronic device structure 100 (FIG. 1A). The second control logic devices 163 may be different than the first control logic devices 113 (FIG. 1A). In some embodiments, the second control logic devices 163 include relatively high performance control logic devices employing relatively high performance control logic circuitry (e.g., relatively high performance CMOS circuitry). The second control logic devices 163 may, for example, be configured to operate at applied voltages less than or equal to (e.g., less than) about 1.4 volts (V), such as within a range of from about 0.7V to about 1.4V (e.g., from about 0.9V to about 1.2V, from about 0.95V to about 1.15V, or about 1.1V).

As a non-limiting example, the second control logic devices 163 included within the second control logic region 152 of the second microelectronic device structure 150 may include devices configured to control column operations for arrays (e.g., memory element array(s), access device array (s)) within the memory array region 104 (FIG. 1A) of the first microelectronic device structure 100 (FIG. 1A), such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As another non-limiting example, the second control logic devices 163 may include devices configured to control row operations for arrays (e.g., memory element array(s), access device array(s)) within the memory array region 104 (FIG. 1A) of the first microelectronic device structure 100 (FIG. 1A), such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices. As a further non-limiting example, the second control logic devices 163 may include may include one or more of string drivers and page buffers.

With continued reference to FIG. 1B, the second interconnect region 154 of the second microelectronic device structure 150 may include second pad structures 164 and second bond pad structures 168. The second pad structures 164 may vertically overlie and be electrically connected to the third routing structures 162 of the second control logic region 152, and the second bond pad structures 168 may vertically overlie and be electrically connected to the second pad structures 164. As shown in FIG. 1B, sixth interconnect structures 166 may vertically extend between and electrically connect the second pad structures 164 and the third routing structures 162, and seventh interconnect structures 169 may vertically extend between and electrically connect the second pad structures 164 and the second bond pad structures 168. The second pad structures 164, the sixth interconnect structures 166, the second bond pad structures 168, and the seventh interconnect structures 169 may each individually be formed of and include conductive material. In some embodiments, the second bond pad structures 168 are formed of and include Cu.

Figure 1C:
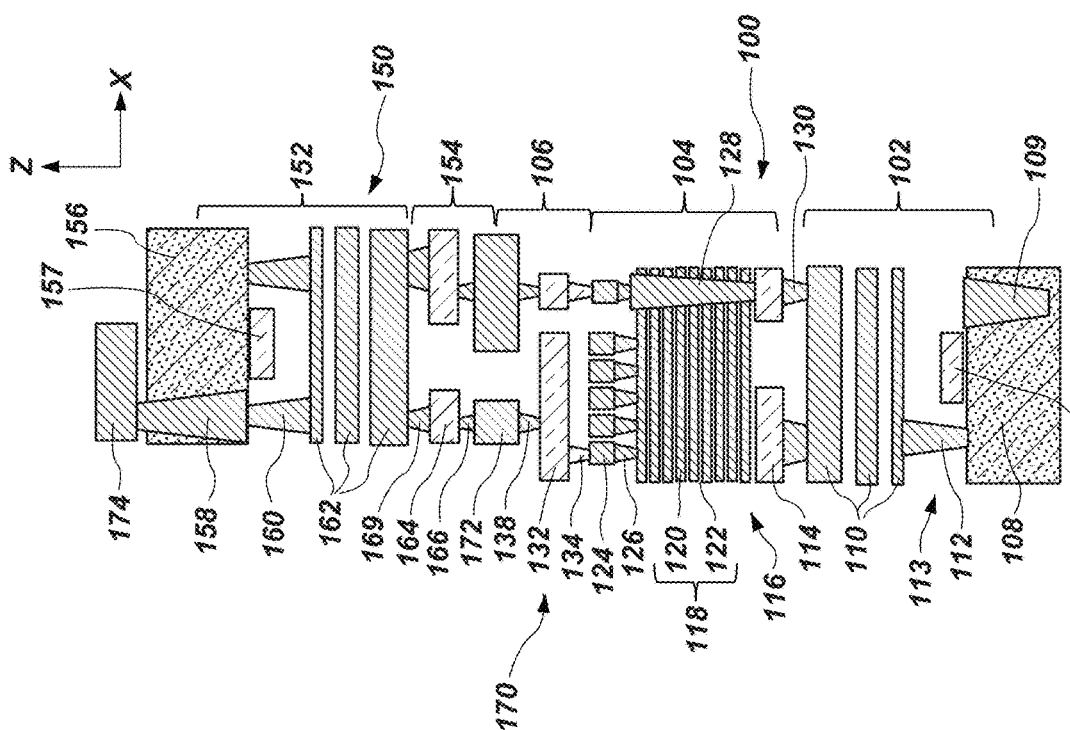

Referring next to FIG. 1C, the second microelectronic device structure 150 may be flipped upside down (e.g., in the Z-direction) and attached (e.g., bonded) to the first microelectronic device structure 100 to form a microelectronic device structure assembly 170. Alternatively, the first microelectronic device structure 100 may be flipped upside down and attached to the second microelectronic device structure 150 to form the microelectronic device structure assembly 170.

As shown in FIG. 1C, the microelectronic device structure assembly 170 may be formed to include eighth interconnect structures 172 vertically intervening between and electrically connecting the second routing structures 132 of the first microelectronic device structure 100 and the second pad structures 164 of the second microelectronic device structure 150. In addition, a dielectric material (e.g., a dielectric oxide material) (omitted from FIG. 1C for clarity and ease of understanding the ease of understanding of the drawings and related description) may cover and surround the eighth interconnect structures 172, and may partially physically couple the first microelectronic device structure 100 to the second microelectronic device structure 150. The second microelectronic device structure 150 may be attached to the first microelectronic device structure 100 without a bond line.

The eighth interconnect structure(s) 172 of the microelectronic device structure assembly 170 may be formed from the first bond pad structures 136 (FIG. 1A) of the first microelectronic device structure 100 and the second bond pad structures 168 (FIG. 1B) of the second microelectronic device structure 150. For example, after flipping the second microelectronic device structure 150, the second bond pad structures 168 (FIG. 1B) thereof may be horizontally aligned with and brought into physical contact with the first bond pad structures 136 (FIG. 1A) of the first microelectronic device structure 100. At least one thermocompression process may then be employed to migrate (e.g., diffuse) and interact material(s) (e.g., Cu) of the first bond pad structures 136 (FIG. 1A) and the second bond pad structures 168 (FIG. 1B) with one another and form the eighth interconnect structure(s) 172.

Still referring to FIG. 1C, the microelectronic device structure assembly 170 may further include one or more wiring pad structures 174 (e.g., wire bond pad structure(s)) coupled (e.g., physically coupled, electrically coupled) to the additional filled via(s) 158 vertically extending through the second semiconductive base structure 156 of the second microelectronic device structure 150. The wiring pad structure(s) 174 may be used to electrically connect the microelectronic device structure assembly 170 to packaging of a microelectronic device including the microelectronic device structure assembly 170. The wiring pad structure(s) 174 may, for example, be coupled to conductive material of the additional filled via(s) 158 after thinning (e.g., in the Z-direction) the second semiconductive base structure 156 from a back side thereof to expose the additional filled via(s) 158 following attachment of the second microelectronic device structure 150 to the first microelectronic device structure 100. In additional embodiments, the additional filled via(s) 158 are formed in the second semiconductive base structure 156 after the attachment of the second microelectronic device structure 150 to the first microelectronic device structure 100, and then the wiring pad structure(s) 174 are coupled to the additional filled via(s) 158.

The microelectronic device structure assembly 170, including the second microelectronic device structure 150 thereof, facilitates improved microelectronic device performance, increased miniaturization of components, and greater packaging density as compared to conventional assembly configurations. For example, the second control logic region 152 (including the second control logic devices 163 thereof) vertically overlying the memory array region 104 (including the vertically extending strings of memory cells thereof) may decrease the amount of time required to switch memory cells of the memory array region 104 between ON states and OFF states (e.g., increase speeds for switching the memory cells between relatively low-resistivity states (ON states) and relatively high-resistivity states (OFF states)) and/or may reduce applied threshold switching voltage ($V_{cc}$) requirements relative to conventional assembly configurations not including the second control logic region 152. Providing the second control logic region 152 vertically over the memory array region 104 may, for example, reduce the distance between the vertically extending strings of memory cells of the memory array region 104 and the second control logic devices 163 (e.g., high performance I/O devices) of the microelectronic device structure assembly 170 relative to conventional configurations including such control logic devices within a conventional base control logic region vertically underlying the memory array region 104. In addition, employing the second control logic devices 163 within the second control logic region 152 instead of the first control logic region 102 may reduce horizontal dimensions of the first control logic region 102 relative to conventional base control logic region configurations, to facilitate relatively smaller horizontal footprints and improved memory array, die, and/or socket area efficiency as compared to conventional configurations.

Referring next to FIG. 1D, after attaching the first microelectronic device structure 100 and the second microelectronic device structure 150 to form the microelectronic device structure assembly 170, the microelectronic device structure assembly 170 may be subjected to additional processing. By way of non-limiting example, optionally, another microelectronic device structure 100' (e.g., an additional die) substantially similar to the first microelectronic device structure 100 may attached to the first microelectronic device structure 100 to form a relatively larger microelectronic device structure assembly 180.

The relatively larger microelectronic device structure assembly 180 may, for example, be formed by thinning (e.g., in the Z-direction) the first semiconductive base structure 108 to expose the filled via(s) 109; coupling bond pad structure(s) to conductive material of the filled via(s) 109; horizontally aligning and physically contacting the bond pad structure(s) with additional bond pad structure(s) (e.g., additional bond pad structure(s) substantially similar to the first bond pad structures 136 (FIG. 1A) of the first microelectronic device structure 100); and then preforming at least one thermocompression process to form one or more ninth interconnect structures 176 (e.g., interconnect structures substantially similar to the eighth interconnect structures 172) vertically intervening between and electrically connecting the first microelectronic device structure 100 and the another microelectronic device structure 100'. Any desirable quantity of additional microelectronic device structures may be attached to the relatively larger microelectronic device structure assembly 180 by way of substantially similar processing.

Thus, in accordance with embodiments of the disclosure, a microelectronic device comprises a memory array region, a control logic region, and an additional control logic region. The memory array region comprises a stack structure comprising vertically alternating conductive structures and insulating structures, and vertically extending strings of memory cells within the stack structure. The control logic region underlies the stack structure and comprises control logic devices configured to effectuate a portion of control operations for the vertically extending strings of memory cells. The additional control logic region overlies the stack structure and comprises additional control logic devices configured to effectuate an additional portion of the control operations for the vertically extending strings of memory cells.

Furthermore, in accordance with embodiments of the disclosures, a method of forming a microelectronic device comprises forming a first microelectronic device structure comprising a control logic region and a memory array region over the control logic region. The control logic region comprises control logic devices. The memory array region comprises a stack structure comprising vertically alternating conductive structures and insulating structures, and vertically extending strings of memory cells within the stack structure. A second microelectronic device structure is formed to comprise an additional control logic region comprising additional control logic devices. The first microelectronic device structure is attached to the second microelectronic device structure such that the stack structure vertically intervenes between the control logic region and the additional control logic region.

FIGS. 2A through 2D are simplified partial cross-sectional views illustrating embodiments of another method of forming a microelectronic device (e.g., a memory device, such as a 3D NAND Flash memory device). With the description provided below, it will be readily apparent to one of ordinary skill in the art that the methods and structures described herein with reference to FIGS. 2A through 2D may be used in various devices and electronic systems.

Figure 2B:
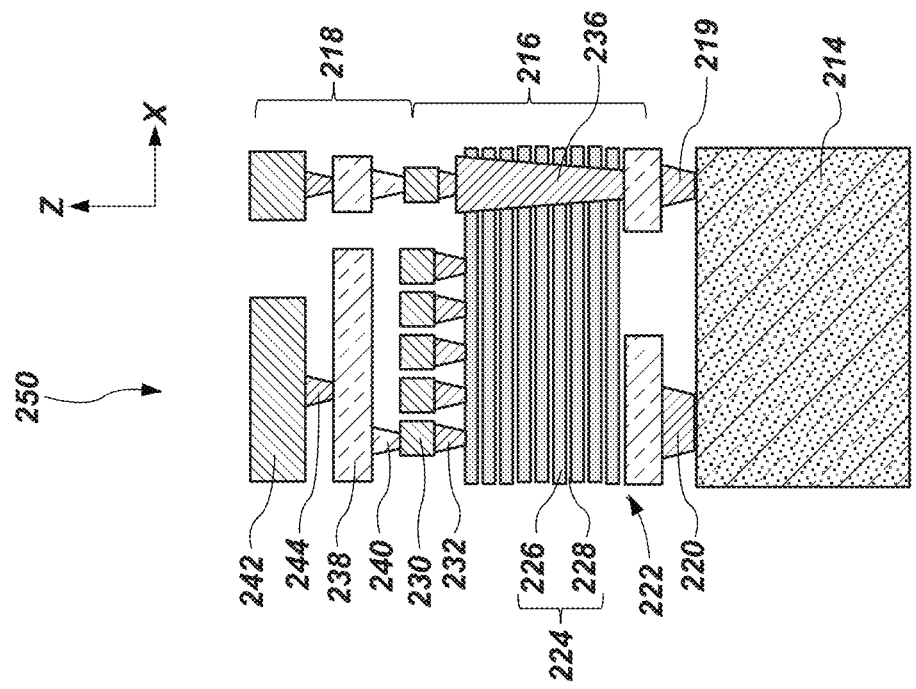
FIGS. 2A through 2D are simplified, partial cross-sectional views illustrating a method of forming a microelectronic device, in accordance with additional embodiments of the disclosure.
Figure 2A:
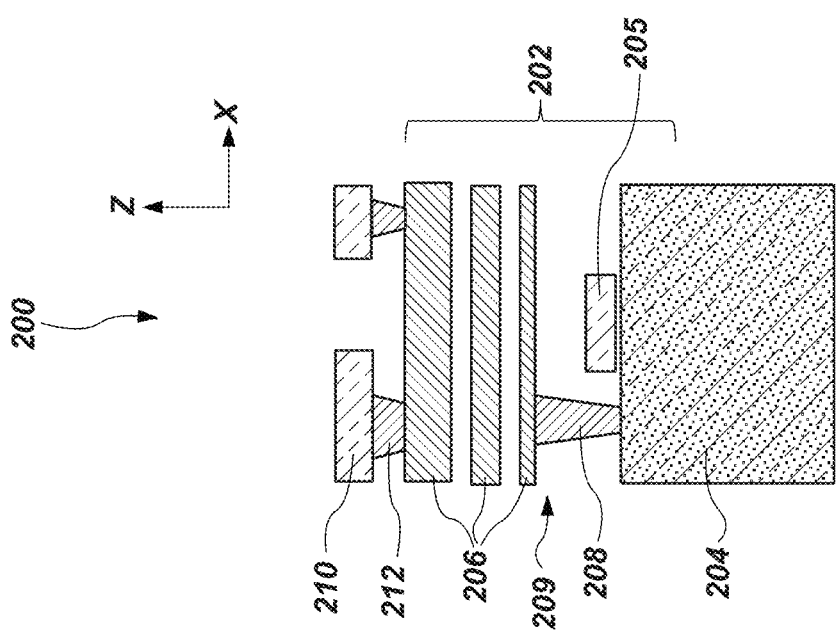

Referring to FIG. 2A, a first microelectronic device structure 200 (e.g., a first die) may be formed to include a control logic region 202. The control logic region 202 includes a semiconductive base structure 204, gate structures 205, first routing structures 206, and first interconnect structures 208. Portions of the semiconductive base structure 204, the gate structures 205, the first routing structures 206, and the first interconnect structures 208 form various control logic devices 209 of the control logic region 202, as described in further detail below.

The semiconductive base structure 204 (e.g., semiconductive wafer) of the control logic region 202 comprises a base material or construction upon which additional materials and structures of the first microelectronic device structure 200 are formed. The semiconductive base structure 204 may comprise a semiconductive structure (e.g., a semiconductive wafer), or a base semiconductive material on a supporting structure. For example, the semiconductive base structure 204 may comprise a conventional silicon substrate (e.g., a conventional silicon wafer), or another bulk substrate comprising a semiconductive material. In some embodiments, the semiconductive base structure 204 comprises a silicon wafer. In addition, the semiconductive base structure 204 may include one or more layers, structures, and/or regions formed therein and/or thereon. For example, the semiconductive base structure 204 may include conductively doped regions and undoped regions. The conductively doped regions may, for example, be employed as source regions and drain regions for transistors of the control logic devices 209 of the control logic region 202; and the undoped regions may, for example, be employed as channel regions for the transistors of the control logic devices 209.

As shown in FIG. 2A, the gate structures 205 of the control logic region 202 of the first microelectronic device structure 200 may vertically overlie portions of the semiconductive base structure 204. The gate structures 205 may individually horizontally extend between and be employed by transistors of the control logic devices 209 within the control logic region 202 of the first microelectronic device structure 200. The gate structures 205 may be formed of and include conductive material. A gate dielectric material (e.g., a dielectric oxide) may vertically intervene (e.g., in the Z-direction) between the gate structures 205 and channel regions (e.g., within the semiconductive base structure 204) of the transistors.

As shown in FIG. 2A, the first routing structures 206 may vertically overlie (e.g., in the Z-direction) the semiconductive base structure 204, and may be electrically connected to the semiconductive base structure 204 by way of the first interconnect structures 208. Some of the first interconnect structures 208 may vertically extend between and electrically couple some of the first routing structures 206, and other of the first interconnect structures 208 may vertically extend between and electrically couple regions (e.g., conductively doped regions, such as source regions and drain regions) of the semiconductive base structure 204 to one or more of the first routing structures 206. The first routing structures 206 and the first interconnect structures 208 may each individually be formed of and include conductive material.

As previously mentioned, portions of the semiconductive base structure 204 (e.g., conductively doped regions serving as source regions and drain regions, undoped regions serving as channel regions), the gate structures 205, the first routing structures 206, and the first interconnect structures 208 form various control logic devices 209 of the control logic region 202. The control logic devices 209 may be configured to control various operations of other components (e.g., memory cells of a memory cell array) of a relatively larger assembly to include the first microelectronic device structure 200, as described in further detail below. As a non-limiting example, the control logic devices 209 may include one or more (e.g., each) of charge pumps (e.g., $V_{CCP}$ charge pumps, $V_{NEGWL}$ charge pumps, DVC2 charge pumps), DLL circuitry (e.g., ring oscillators), $V_{dd}$ regulators, string drivers, page buffers, and various chip/deck control circuitry. As another non-limiting example, the control logic devices 209 may include devices configured to control column operations for arrays (e.g., memory element array(s), access device array(s)) within a memory array region of another (e.g., second) microelectronic device structure to be coupled to the first microelectronic device structure 200, such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As a further non-limiting example, the control logic devices 209 may include devices configured to control row operations for arrays (e.g., memory element array(s), access device array(s)) within the memory array region of the another microelectronic device structure to be coupled to the first microelectronic device structure 200, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices.

With continued reference to FIG. 2A, the first microelectronic device structure 200 may further include first pad structures 210 and second interconnect structures 212 vertically overlying and in electrical communication with the first routing structures 206 of the control logic region 202. As shown in FIG. 2A, the first pad structures 210 may vertically overlie the first routing structures 206, and the second interconnect structures 212 may vertically extend between and electrically connect the first pad structures 210 and the first routing structures 206. The first pad structures 210 and the second interconnect structures 212 may each individually be formed of and include conductive material.

Referring next to FIG. 2B, a second microelectronic device structure 250 (e.g., a second die) may be formed to include a base structure 214 (e.g., a base wafer, a support wafer), a memory array region 216 vertically over (e.g., in the Z-direction) the base structure 214, and an interconnect region 218 vertically over and in electrical communication with the memory array region 216. The memory array region 216 may be vertically interposed between the base structure 214 and the interconnect region 218.

The base structure 214 may comprise a base material or construction upon which additional materials and structures of the second microelectronic device structure 250 are formed. The base structure 214 may be a conventional silicon substrate (e.g., a conventional silicon wafer), or another bulk substrate. By way of non-limiting example, a base structure 214 may comprise one or more of silicon, silicon dioxide, silicon with native oxide, silicon nitride, a carbon-containing silicon nitride, glass, semiconductor, metal oxide, metal, titanium nitride, carbon-containing titanium nitride, Ta, tantalum nitride, carbon-containing tantalum nitride, niobium, niobium nitride, carbon-containing niobium nitride, molybdenum, molybdenum nitride, carbon-containing molybdenum nitride, W, tungsten nitride, carbon-containing tungsten nitride, Cu, Co, Ni, Fe, Al, and a noble metal. In some embodiments, the base structure 214 comprises a silicon wafer.

The memory array region 216 of the second microelectronic device structure 250 may include a stack structure 222, line structures 230 (e.g., digit line structures, bit line structures), and line contact structures 232. As shown in FIG. 2B, the line structures 230 may vertically overlie (e.g., in the Z-direction) the stack structure 222, and may be electrically connected to structures (e.g., pillar structures, filled vias) within the stack structure 222 by way of the line contact structures 232. The line contact structures 232 may vertically extend between and electrically couple individual line structures 230 and individual structures within the stack structure 222. The line structures 230 and the line contact structures 232 may each individually be formed of and include conductive material.

The stack structure 222 of the memory array region 216 includes a vertically alternating (e.g., in the Z-direction) sequence of conductive structures 226 and insulative structures 228 arranged in tiers 224. Stack structure 222 (including the tiers 224 of conductive structures 226 and insulative structures 228 thereof) may be substantially similar to the stack structure 116 (including the tiers 118 of conductive structures 120 and insulative structures 122 thereof) previously described with reference to FIG. 1A. In addition, at least one deep contact structure 236 may vertically extend through the stack structure 222. The deep contact structure(s) 236 may be configured and positioned to electrically connect one or more components of the second microelectronic device structure 250 vertically overlying the stack structure 222 with one or more components of the second microelectronic device structure 250 vertically underlying the stack structure 222. The deep contact structure(s) 236 may be formed of and include conductive material.

The memory array region 216 further includes additional structures and/or devices on, over, and/or within the stack structure 222. As a non-limiting example, the memory array region 216 includes cell pillar structures vertically extending through the stack structure 222. Intersections of the cell pillar structures and the conductive structures 226 of the tiers 224 of the stack structure 222 may define vertically extending strings of memory cells coupled in series with one another within the memory array region 216 of the second microelectronic device structure 250. The cell pillar structures and the vertically extending strings of memory cells may respectively be substantially similar to the cell pillar structures and the vertically extending strings of memory cells previously described with reference to FIG. 1A.

With continued reference to FIG. 2B, the second microelectronic device structure 250 may further include second pad structures 220 and third interconnect structures 219 vertically interposed between the memory array region 216 and the base structure 214. The second pad structures 220 may vertically underlie the stack structure 222, and the third interconnect structures 219 may vertically extend between the second pad structures 220 and the base structure 214. Components (e.g., structures, devices) of the memory array region 216 may land on (e.g., physically contact) the second pad structures 220, and the third interconnect structures 219 may physically contact the second pad structures 220 and the base structure 214. The second pad structures 220 and the third interconnect structures 219 may each individually be formed of and include conductive material.

With continued reference to FIG. 2B, the interconnect region 218 of the second microelectronic device structure 250 may include second routing structures 238 and bond pad structures 242. The second routing structures 238 may vertically overlie and be electrically connected to the line structures 230 of the memory array region 216, and the bond pad structures 242 may vertically overlie and be electrically connected to the second routing structures 238. As shown in FIG. 2B, fourth interconnect structures 240 may vertically extend between and electrically connect the second routing structures 238 and the line structures 230, and fifth interconnect structures 244 may vertically extend between and electrically connect the second routing structures 238 and the bond pad structures 242. The second routing structures 238, the fourth interconnect structures 240, the bond pad structures 242, and the fifth interconnect structures 244 may each individually be formed of and include conductive material. In some embodiments, the second routing structures 238 are formed of and include Al, and the bond pad structures 242 are formed of and include Cu.

Figure 2D:
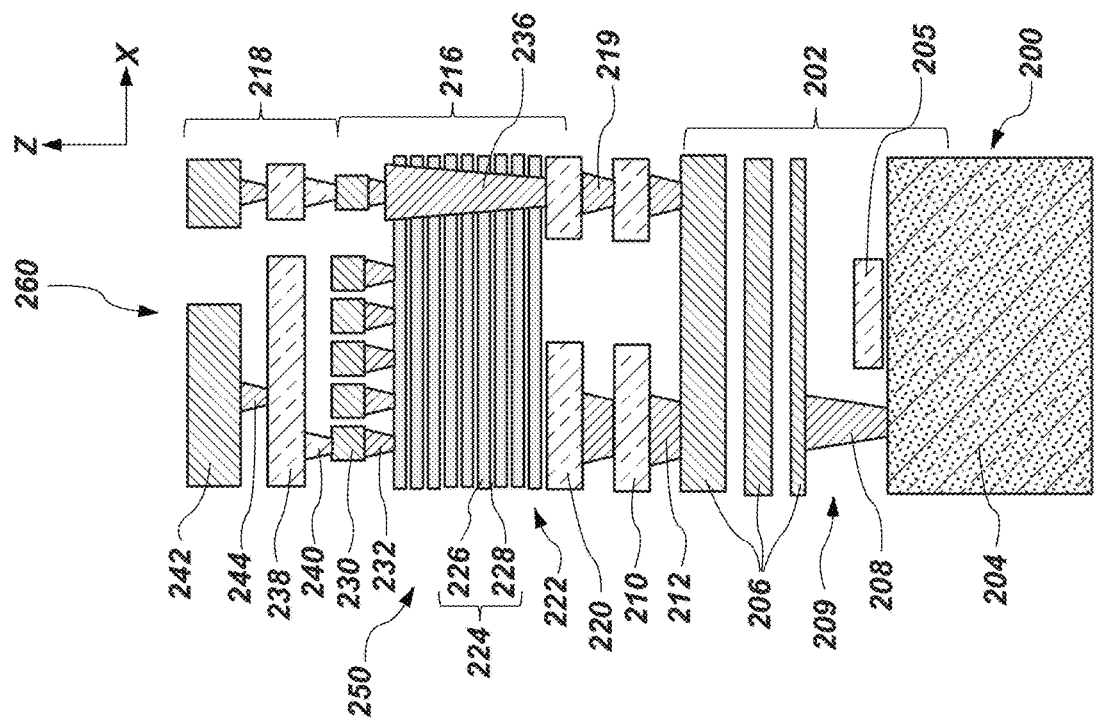
Figure 2C:
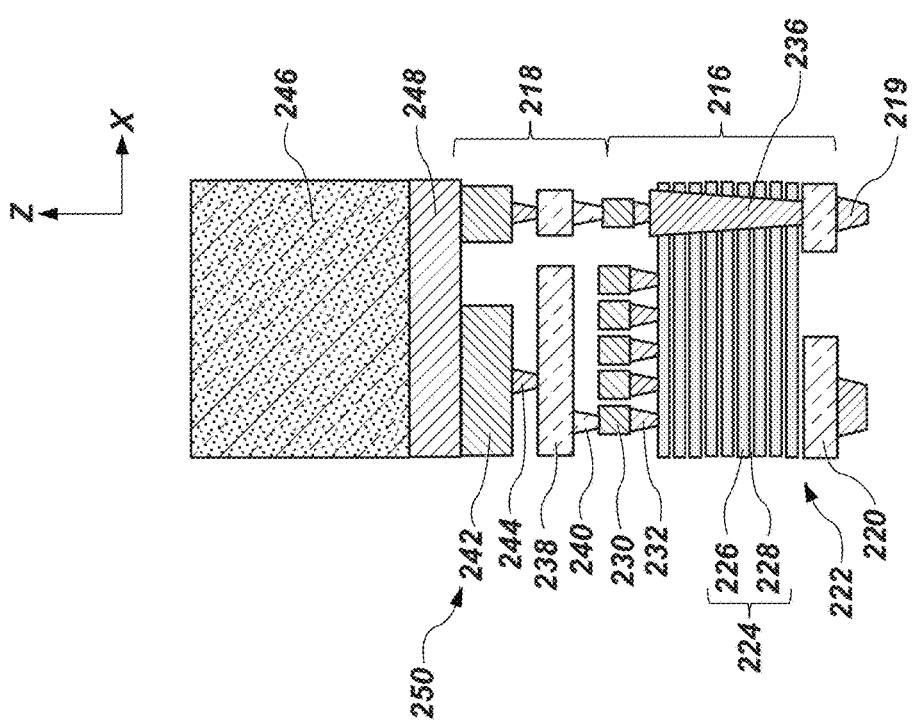

Referring next to FIG. 2C, the base structure 214 (FIG. 2B) may be removed (e.g., detached) from the second microelectronic device structure 250, and a carrier structure 246 (e.g., a carrier wafer) may be attached (e.g., bonded) to the bond pad structures 242 by way of an adhesive material 248. The carrier structure 246 and the adhesive material 248 may be configured to facilitate safe handling of the second microelectronic device structure 250 for further processing (e.g., attachment to the first microelectronic device structure 200 (FIG. 2A)), as described in further detail below. The carrier structure 246 and the adhesive material 248 may respectively comprise a conventional carrier structure (e.g., a conventional carrier wafer) and a conventional adhesive material, and are thus not described in detail herein. In addition, the base structure 214 (FIG. 2B) may be removed from the second microelectronic device structure 250 using conventional removal processes (e.g., conventional detachment processes, conventional grinding processes) and conventional equipment, which are also not described in detail herein.

Next, referring to FIG. 2D, the second microelectronic device structure 250 may be attached (e.g., bonded) to the first microelectronic device structure 200 to form a microelectronic device structure assembly 260, and the carrier structure 246 (FIG. 2C) and the adhesive material 248 (FIG. 2C) may be removed. As shown in FIG. 2D, the third interconnect structures 219 of the second microelectronic device structure 250 may be positioned on the first pad structures 210 of the first microelectronic device structure 200. In addition, a dielectric material (e.g., a dielectric oxide material) (omitted from FIG. 2D for clarity and ease of understanding the ease of understanding of the drawings and related description) may cover and surround the first pad structures 210, the second interconnect structures 212, the third interconnect structures 219, and the second pad structures 220, and may at least partially physically couple the second microelectronic device structure 250 to the first microelectronic device structure 200. The second microelectronic device structure 250 may be attached to the first microelectronic device structure 200 without a bond line.

After attaching the second microelectronic device structure 250 to the first microelectronic device structure 200, the carrier structure 246 (FIG. 2C) and the adhesive material 248 (FIG. 2C) may be removed from the microelectronic device structure assembly 260 using conventional removal processes (e.g., conventional detachment processes, conventional grinding processes) and conventional equipment, which are not described in detail herein.

The method described above with reference to FIGS. 2A through 2D resolves limitations on control logic device configurations and associated microelectronic device performance (e.g., speed, data transfer rates, power consumption) that may otherwise result from thermal budget constraints imposed by the formation and/or processing of arrays (e.g., memory cell arrays, memory element arrays, access device arrays) of the microelectronic device. For example, by forming the first microelectronic device structure 200 separate from the second microelectronic device structure 250, configurations of the control logic devices 209 within the control logic region 202 of the first microelectronic device structure 200 are not limited by the processing conditions (e.g., temperatures, pressures, materials) required to form components (e.g., memory cells, memory elements, access devices) of the memory array region 216 of the second microelectronic device structure 250, and vice versa. In addition, forming the features (e.g., structures, materials, openings) of the memory array region 216 over the base structure 214 (FIG. 2B) may impede undesirable out-of-plane deformations (e.g., curvature, warping, bending, bowing, dishing) of components (e.g., the tiers 224 of the stack structure 222) that may otherwise occur during the various deposition, patterning, doping, etching, and annealing processes utilized to form different components of at least the memory array region 216.

Thus, in accordance with embodiments of the disclosure, a microelectronic device comprises a memory array region, first conductive pad structures, second conductive pad structures, and a control logic region. The memory array region comprises a stack structure comprising a vertically alternating sequence of conductive structures and insulating structures, and vertically extending strings of memory cells within the stack structure. The first conductive pad structures underlie the stack structure of the memory array region. The second conductive pad structures underlie the first conductive pad structures. The control logic region underlies the second conductive pad structures and comprises control logic devices comprising CMOS circuitry.

Furthermore, in accordance with embodiments of the disclosure, a method of forming a microelectronic device comprises forming a first microelectronic device structure comprising a control logic region comprising control logic devices. A second microelectronic device structure is formed to comprise a base structure, and a memory array region overlying the base structure. The memory array region comprises a stack structure comprising vertically alternating conductive structures and insulating structures, and vertically extending strings of memory cells within the stack structure. The base structure is removed from the second microelectronic device structure. A remainder of the second microelectronic device structure is attached to the first microelectronic device structure such that the control logic region of the first microelectronic device structure underlies the memory array region of the second microelectronic device structure.

FIGS. 3A through 3D are simplified partial cross-sectional views illustrating embodiments of another method of forming a microelectronic device (e.g., a memory device, such as a 3D NAND Flash memory device). With the description provided below, it will be readily apparent to one of ordinary skill in the art that the methods and structures described herein with reference to FIGS. 3A through 3D may be used in various devices and electronic systems.

Figure 3B:
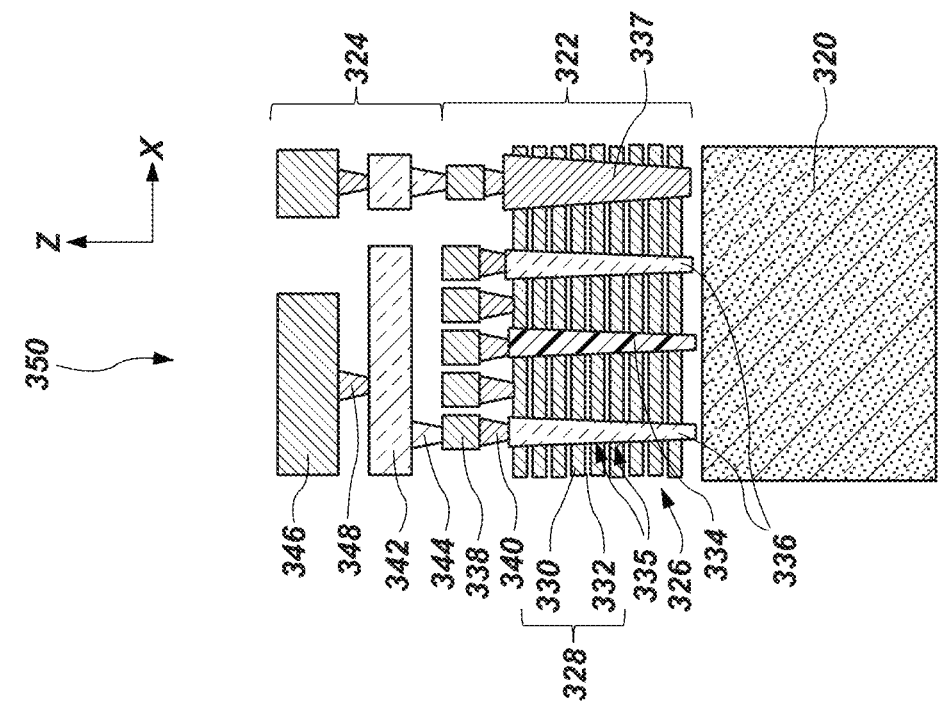
FIGS. 3A through 3D are simplified, partial cross-sectional views illustrating a method of forming a microelectronic device, in accordance with yet additional embodiments of the disclosure.
Figure 3A:
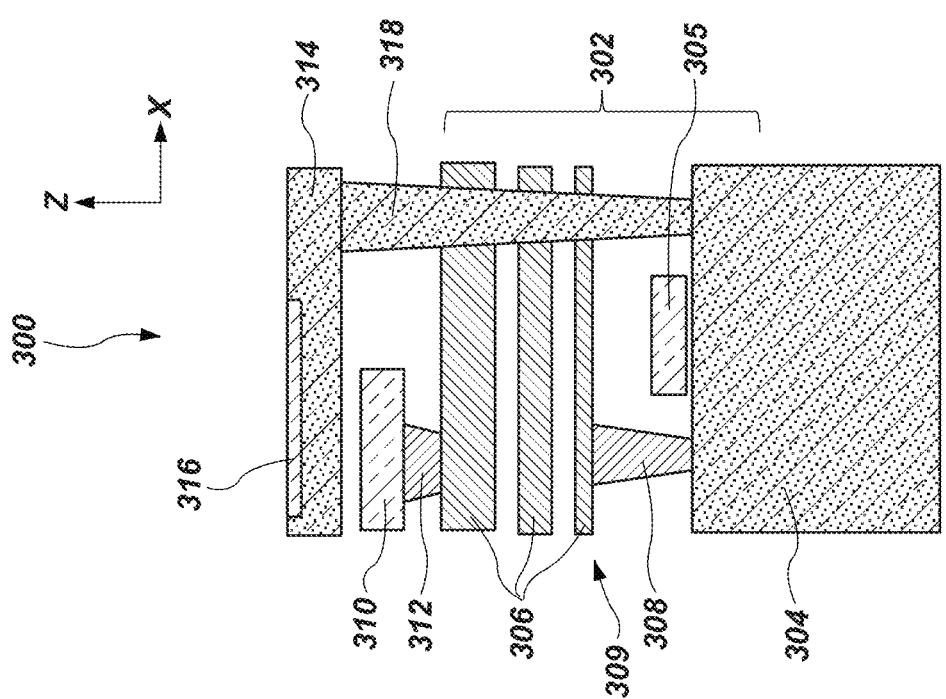

Referring to FIG. 3A, a first microelectronic device structure 300 (e.g., a first die) may be formed to include a control logic region 302, including a semiconductive base structure 304, gate structures 305, first routing structures 306, and first interconnect structures 308. Portions of the semiconductive base structure 304, the gate structures 305, the first routing structures 306, and the first interconnect structures 308 form various control logic devices 309 of the control logic region 302. The semiconductive base structure 304, the gate structures 305, the first routing structures 306, the first interconnect structures 308, and the control logic devices 309 of the control logic region 302 may respectively be substantially similar to the semiconductive base structure 204, the gate structures 205, the first routing structures 206, the first interconnect structures 208, and the control logic devices 209 previously described with reference to FIG. 2A. In addition, the first microelectronic device structure 300 may further include pad structures 310 and second interconnect structures 312 vertically overlying and in electrical communication with the first routing structures 306 of the control logic region 302. The pad structures 310 and second interconnect structures 312 may respectively be substantially similar to the first pad structures 210 and second interconnect structures 212 previously described with reference to FIG. 2A.

Still referring to FIG. 3A, the first microelectronic device structure 300 is formed to further include an additional semiconductive structure 314 vertically overlying (e.g., in the Z-direction) the control logic region 302 (e.g., vertically overlying the first pad structures 210 vertically overlying the first routing structures 306 of the control logic region 302), and one or more semiconductive pillar structures 318 vertically extending (e.g., in the Z-direction) from and between the semiconductive base structure 304 and the additional semiconductive structure 314. As shown in FIG. 3A, the semiconductive pillar structure(s) 318 may vertically extend from the additional semiconductive structure 314, through the first routing structures 306 of the control logic region 302, and to the semiconductive base structure 304.

The additional semiconductive structure 314 and the semiconductive pillar structure(s) 318 may each individual be formed of and include semiconductive material (e.g., a silicon material, such a monocrystalline silicon or polycrystalline silicon; a silicon-germanium material; a germanium material; a gallium arsenide material; a gallium nitride material; an indium phosphide material; a combination thereof). In some embodiments, the additional semiconductive structure 314 and the semiconductive pillar structure(s) 318 are each formed of and include monocrystalline silicon.

In addition, the additional semiconductive structure 314 may be formed to include at least one conductively doped region 316 therein. The conductively doped region 316 of the additional semiconductive structure 314 may be doped with one or more conductive dopants (e.g., one or more N-type dopants, such as one or more of phosphorus, arsenic, antimony, and bismuth; one or more P-type dopant, such as one or more of boron, aluminum, and gallium), and may serve as a source region for vertically extending strings of memory cells to be coupled thereto, as described in further detail below.

In some embodiments, the additional semiconductive structure 314 is formed by epitaxial growth, followed by dopant implantation to form the conductively doped region 316 thereof. In additional embodiments, the additional semiconductive structure 314 is formed (e.g., cut) from an additional semiconductive structure (e.g., a separate, relatively semiconductive structure, such as a separate silicon wafer), and is then provided (e.g., placed) vertically over the control logic region 302. For example, hydrogen ions may be implanted in the additional semiconductive structure at a desired vertical depth, the additional semiconductive structure may be heated to form voids (e.g., pockets, bubbles) in the additional semiconductive structure at the desired vertical depth and effectively cut the additional semiconductive structure 314 from the additional semiconductive structure, and then the additional semiconductive structure 314 may be provided over the control logic region 302. The conductively doped region 316 of the additional semiconductive structure 314 may be formed before or after providing the additional semiconductive structure 314 over the control logic region 302.

Referring next to FIG. 3B, a second microelectronic device structure 350 (e.g., another die) may be formed to include a base structure 320 (e.g., a base wafer), a memory array region 322 vertically over (e.g., in the Z-direction) the base structure 320, and an interconnect region 324 vertically over and in electrical communication with the memory array region 322. The memory array region 322 may be vertically interposed between the base structure 320 and the interconnect region 324. The base structure 320 may be substantially similar to the base structure 214 previously described with reference to FIG. 2B.

The memory array region 322 of the second microelectronic device structure 350 may include a stack structure 326, line structures 338 (e.g., digit line structures, bit line structures), and line contact structures 340. As shown in FIG. 3B, the line structures 338 may vertically overlie (e.g., in the Z-direction) the stack structure 326, and may be electrically connected to structures (e.g., pillar structures, filled vias) within the stack structure 326 by way of the line contact structures 340. The line contact structures 340 may vertically extend between and electrically couple individual line structures 338 and individual structures within the stack structure 326. The line structures 338 and the line contact structures 340 may each individually be formed of and include conductive material.

The stack structure 326 of the memory array region 322 includes a vertically alternating (e.g., in the Z-direction) sequence of conductive structures 330 and insulative structures 332 arranged in tiers 328. Stack structure 326 (including the tiers 328 of conductive structures 330 and insulative structures 332 thereof) may be substantially similar to the stack structure 116 (including the tiers 118 of conductive structures 120 and insulative structures 122 thereof) previously described with reference to FIG. 1A. In addition, at least one deep contact structure 337 may vertically extend through the stack structure 326. For example, as shown in FIG. 3B, the deep contact structure(s) 337 may vertically extend from an upper vertical boundary of the stack structure 326, through the stack structure 326, and to a location at or proximate an upper vertical boundary of the base structure 320 (e.g., within a dielectric material on the base structure 320). The deep contact structure(s) 337 may be formed of and include conductive material.

As shown in FIG. 3B, the memory array region 322 further includes cell pillar structures 336 vertically extending through the stack structure 326. Intersections of the cell pillar structures 336 and the conductive structures 330 of the tiers 328 of the stack structure 326 may define vertically extending strings of memory cells 335 coupled in series with one another within the memory array region 322 of the second microelectronic device structure 350. The cell pillar structures 336 and the vertically extending strings of memory cells 335 may respectively be substantially similar to the cell pillar structures and the vertically extending strings of memory cells previously described with reference to FIG. 1A. The cell pillar structures 336 may vertically extend from an upper vertical boundary of the stack structure 326, through the stack structure 326, and to a location at or proximate an upper vertical boundary of the base structure 320 (e.g., within a dielectric material on the base structure 320).

Still referring to FIG. 3B, the memory array region 322 also includes conductive contact structures 334 (e.g., source contact structures) vertically extending through the stack structure 326. The conductive contact structures 334 may be horizontally positioned within filled slots vertically extending through the stack structure 326. The filled slots may divide the stack structure 326 into multiple (e.g., a plurality of) blocks separated from one another by the filled slots. The conductive contact structures 334 may vertically extend from an upper vertical boundary of the stack structure 326, through the stack structure 326, and to a location at or proximate an upper vertical boundary of the base structure 320 (e.g., within a dielectric material on the base structure 320). The conductive contact structures 334 may be sized, shaped, and positioned to contact the conductively doped region 316 (FIG. 3A) of the additional semiconductive structure 314 (FIG. 3A) of the first microelectronic device structure 300 (FIG. 3A) upon further processing of the second microelectronic device structure 350 and the first microelectronic device structure 300 (FIG. 3A), as described in further detail below.

With continued reference to FIG. 3B, the interconnect region 324 of the second microelectronic device structure 350 may include second routing structures 342 and bond pad structures 346. The second routing structures 342 may vertically overlie and be electrically connected to the line structures 338 of the memory array region 322, and the bond pad structures 346 may vertically overlie and be electrically connected to the second routing structures 342. As shown in FIG. 3B, third interconnect structures 344 may vertically extend between and electrically connect the second routing structures 342 and the line structures 338, and fourth interconnect structures 348 may vertically extend between and electrically connect the second routing structures 342 and the bond pad structures 346. The second routing structures 342, the third interconnect structures 344, the bond pad structures 346, and the fourth interconnect structures 348 may each individually be formed of and include conductive material. In some embodiments, the second routing structures 342 are formed of and include Al, and the bond pad structures 346 are formed of and include Cu.

Figure 3D:
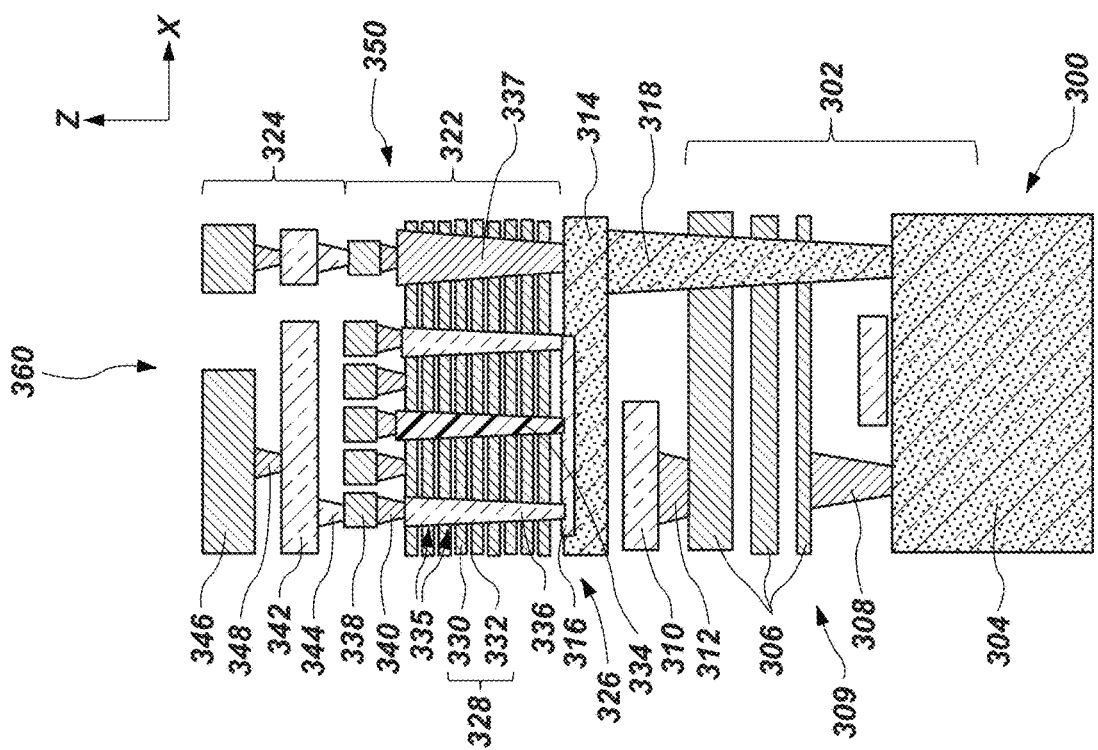
Figure 3C:
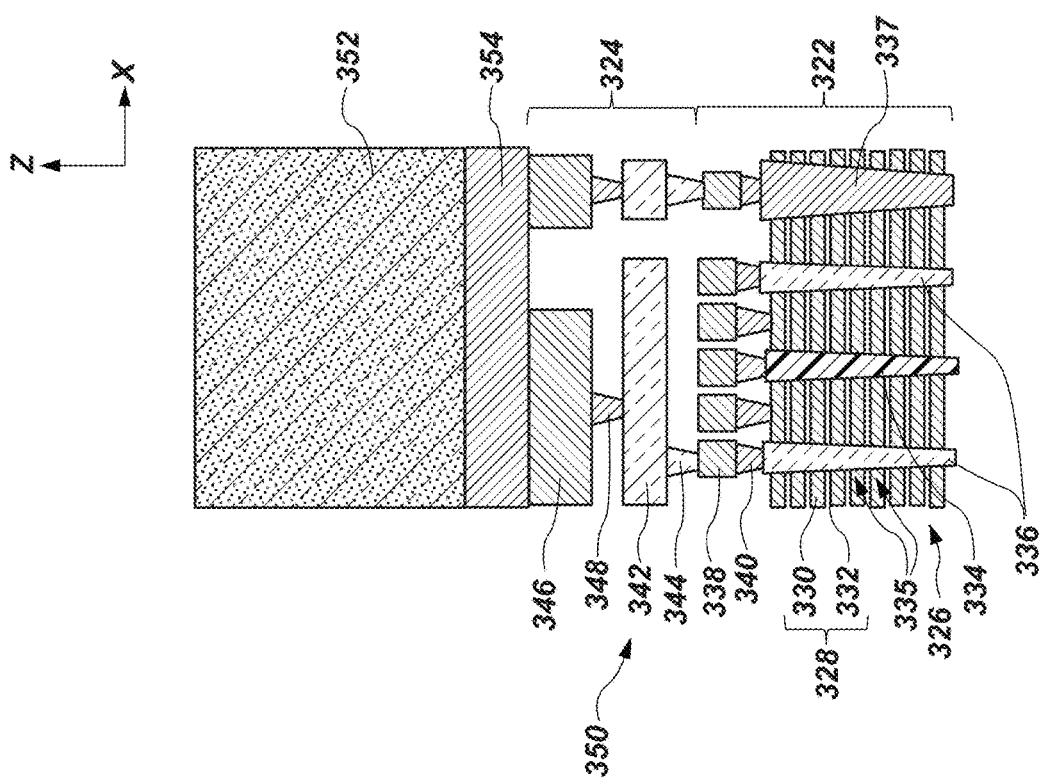

Referring next to FIG. 3C, the base structure 320 (FIG. 3B) may be removed (e.g., detached) from the second microelectronic device structure 350, and a carrier structure 352 (e.g., a carrier wafer) may be attached (e.g., bonded) to the bond pad structures 346 by way of an adhesive material 354. The carrier structure 352 and the adhesive material 354 may be configured to facilitate safe handling of the second microelectronic device structure 350 for further processing (e.g., attachment to the first microelectronic device structure 300 (FIG. 3A)), as described in further detail below. The carrier structure 352 and the adhesive material 354 may respectively comprise a conventional carrier structure (e.g., a conventional carrier wafer) and a conventional adhesive material, and are thus not described in detail herein. In addition, the base structure 320 (FIG. 3B) may be removed from the second microelectronic device structure 350 using conventional removal processes (e.g., conventional detachment processes, conventional grinding processes) and conventional equipment, which are also not described in detail herein.

Next, referring to FIG. 3D, the second microelectronic device structure 350 may be attached (e.g., bonded) to the first microelectronic device structure 300 to form a microelectronic device structure assembly 360, and the carrier structure 352 (FIG. 3C) and the adhesive material 354 (FIG. 3C) may be removed. The second microelectronic device structure 350 may be attached to the first microelectronic device structure 300 without a bond line. As shown in FIG. 3D, the conductive contact structures 334, the cell pillar structures 336, and the deep contact structure(s) 337 of the second microelectronic device structure 350 may be positioned on the additional semiconductive structure 314 of the first microelectronic device structure 300. The conductive contact structures 334 and the cell pillar structures 336 of the second microelectronic device structure 350 may contact (e.g., physically contact, electrically contract) the conductively doped region 316 (e.g., source region) of the additional semiconductive structure 314.

After attaching the second microelectronic device structure 350 to the first microelectronic device structure 300, the carrier structure 352 (FIG. 3C) and the adhesive material 354 (FIG. 3C) may be removed from the microelectronic device structure assembly 360 using conventional removal processes (e.g., conventional detachment processes, conventional grinding processes) and conventional equipment, which are not described in detail herein.

The method described above with reference to FIGS. 3A through 3D advantageously permits the cell pillar structures 336 and conductive contact structures 334 (as well as the filled slots associated therewith) to be formed within the stack structure 326 without the difficulties and problems conventionally associated with forming cell pillar structures and conductive contact structures within a conventional stack structure vertically overlying a source structure or a source region. For example, forming the cell pillar structures 336 and the conductive contact structures 334 within the stack structure 326 while the stack structure 326 vertically overlies the base structure 320 (FIG. 3B), rather than when the stack structure 326 vertically overlies the conductively doped region 316 of the additional semiconductive structure 314, alleviates processing complexities and/or undesirable damage (e.g., corrosion damage) to the conductively doped region 316 that may otherwise occur (e.g., during etching processes to form openings in a preliminary stack structure to be filled with the cell pillar structures 336 and the conductive contact structures 334) if the conductively doped region 316 was vertically under the stack structure 326 during the process of forming the cell pillar structures 336 and the conductive contact structures 334. In addition, the method described above with reference to FIGS. 3A through 3D also benefits from the advantages previously discussed herein with respect to the method described with reference to FIGS. 2A through 2D.

FIGS. 4A through 4D are simplified partial cross-sectional views illustrating embodiments of another method of forming a microelectronic device (e.g., a memory device, such as a 3D NAND Flash memory device). With the description provided below, it will be readily apparent to one of ordinary skill in the art that the methods and structures described herein with reference to FIGS. 4A through 4D may be used in various devices and electronic systems.

Figure 4B:
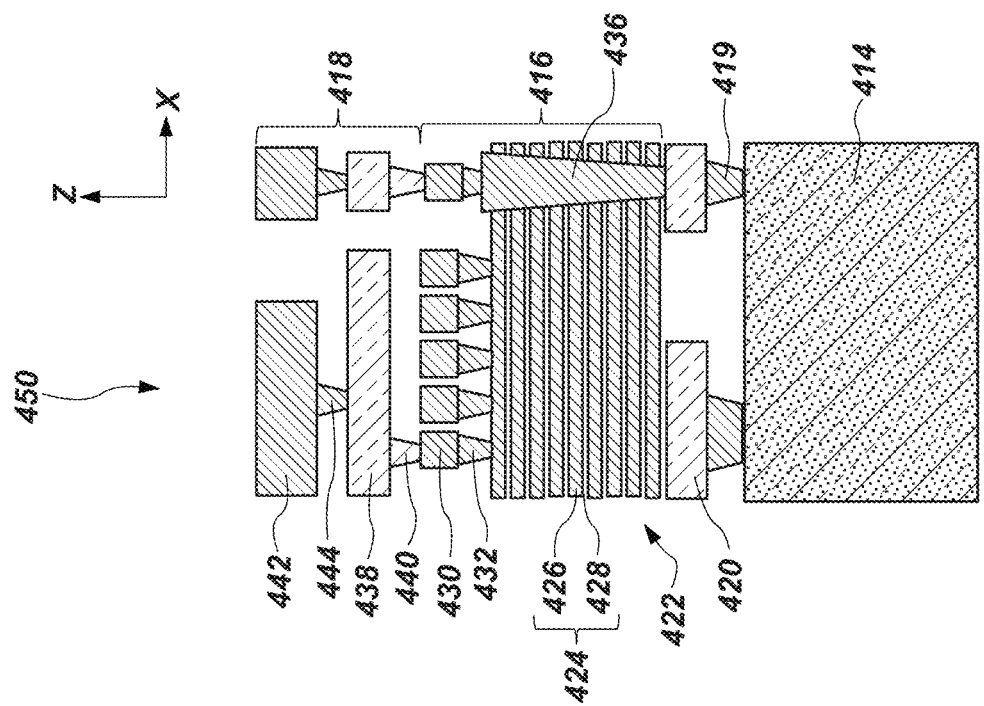
FIGS. 4A through 4D are simplified, partial cross-sectional views illustrating a method of forming a microelectronic device, in accordance with further embodiments of the disclosure.
Figure 4A:
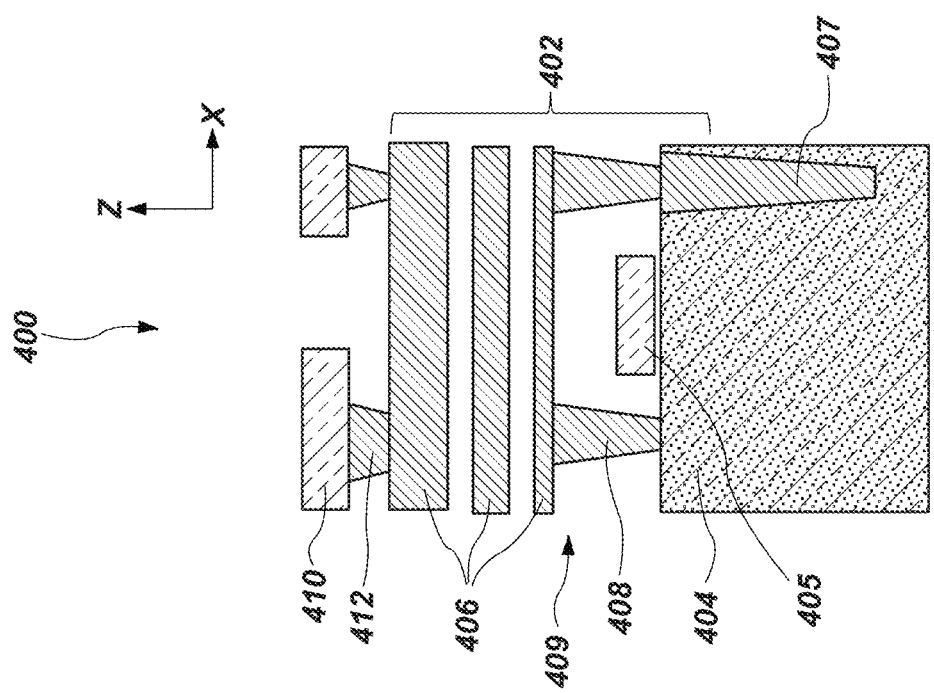

Referring to FIG. 4A, a first microelectronic device structure 400 (e.g., a first die) may be formed to include a control logic region 402, including a semiconductive base structure 404, gate structures 405, first routing structures 406, and first interconnect structures 408. Portions of the semiconductive base structure 404, the gate structures 405, the first routing structures 406, and the first interconnect structures 408 form various control logic devices 409 of the control logic region 402. The semiconductive base structure 404, the gate structures 405, the first routing structures 406, the first interconnect structures 408, and the control logic devices 409 of the control logic region 402 may respectively be substantially similar to the semiconductive base structure 204, the gate structures 205, the first routing structures 206, the first interconnect structures 208, and the control logic devices 209 previously described with reference to FIG. 2A. Optionally, the semiconductive base structure 404 may also include one or more filled vias 407 (e.g., filled TSVs) at least partially (e.g., less than completely, completely) vertically extending therethrough. If present, the filled via(s) 407 may be at least partially (e.g., substantially) filled with conductive material. The filled via(s) 407 may be employed to facilitate electrical connections between one or more components of the first microelectronic device structure 400 at a first side (e.g., a front side, a top side) of the semiconductive base structure 404 and additional components (e.g., one or more structures and/or devices) to be provided at a second, opposing side (e.g., a back side, a bottom side) of the semiconductive base structure 404, as described in further detail below. In additional embodiments, the filled via(s) 407 are omitted (e.g., absent) from the semiconductive base structure 404.

As shown in FIG. 4A, the first microelectronic device structure 400 may also be formed to include first pad structures 410 and second interconnect structures 412 vertically overlying and in electrical communication with the first routing structures 406 of the control logic region 402. The first pad structures 410 and second interconnect structures 412 may respectively be substantially similar to the first pad structures 210 and second interconnect structures 212 previously described with reference to FIG. 2A.

Referring next to FIG. 4B, a second microelectronic device structure 450 (e.g., another die) may be formed to include a base structure 414 (e.g., a base wafer), a memory array region 416 vertically over (e.g., in the Z-direction) the base structure 414, and an interconnect region 418 vertically over and in electrical communication with the memory array region 416. The memory array region 416 may be vertically interposed between the base structure 414 and the interconnect region 418. The base structure 414 may be substantially similar to the base structure 214 previously described with reference to FIG. 2B.

The memory array region 416 of the second microelectronic device structure 250 may include a stack structure 422 including vertically alternating (e.g., in the Z-direction) sequence of conductive structures 426 and insulative structures 428 arranged in tiers 424; line structures 430 (e.g., digit line structures, bit line structures); line contact structures 432; and deep contact structure(s) 436. The stack structure 422 (including the tiers 424 of conductive structures 426 and insulative structures 428 thereof), the line structures 430, the line contact structures 432, and the deep contact structure(s) 436 may respectively be substantially similar to the stack structure 222 (including the tiers 224 of conductive structures 226 and insulative structures 228 thereof), the line structures 230, the line contact structures 232, and the deep contact structure(s) 236 previously described with reference to FIG. 2B.

The memory array region 416 of the second microelectronic device structure 450 further includes additional structures and/or devices on, over, and/or within the stack structure 422. As a non-limiting example, the memory array region 416 includes cell pillar structures vertically extending through the stack structure 422. Intersections of the cell pillar structures and the conductive structures 426 of the tiers 424 of the stack structure 422 may define vertically extending strings of memory cells coupled in series with one another within the memory array region 416 of the second microelectronic device structure 450. The cell pillar structures and the vertically extending strings of memory cells may respectively be substantially similar to the cell pillar structures and the vertically extending strings of memory cells previously described with reference to FIG. 1A.

The second microelectronic device structure 450 may further include second pad structures 420 and third interconnect structures 419 vertically interposed between the memory array region 416 and the base structure 414. The second pad structures 420 and the third interconnect structures 419 may respectively be substantially similar to the second pad structures 220 and the third interconnect structures 219 previously described with reference to FIG. 2B.

Still referring to FIG. 4B, the interconnect region 418 of the second microelectronic device structure 450 may include second routing structures 438, fourth interconnect structures 440, bond pad structures 442, and fifth interconnect structures 444. The second routing structures 438, the fourth interconnect structures 440, the bond pad structures 442, and the fifth interconnect structures 444 may respectively be substantially similar to the second routing structures 238, the fourth interconnect structures 240, the bond pad structures 242, and the fifth interconnect structures 244 previously described with reference to FIG. 2B.

Figures 4C, 4D:
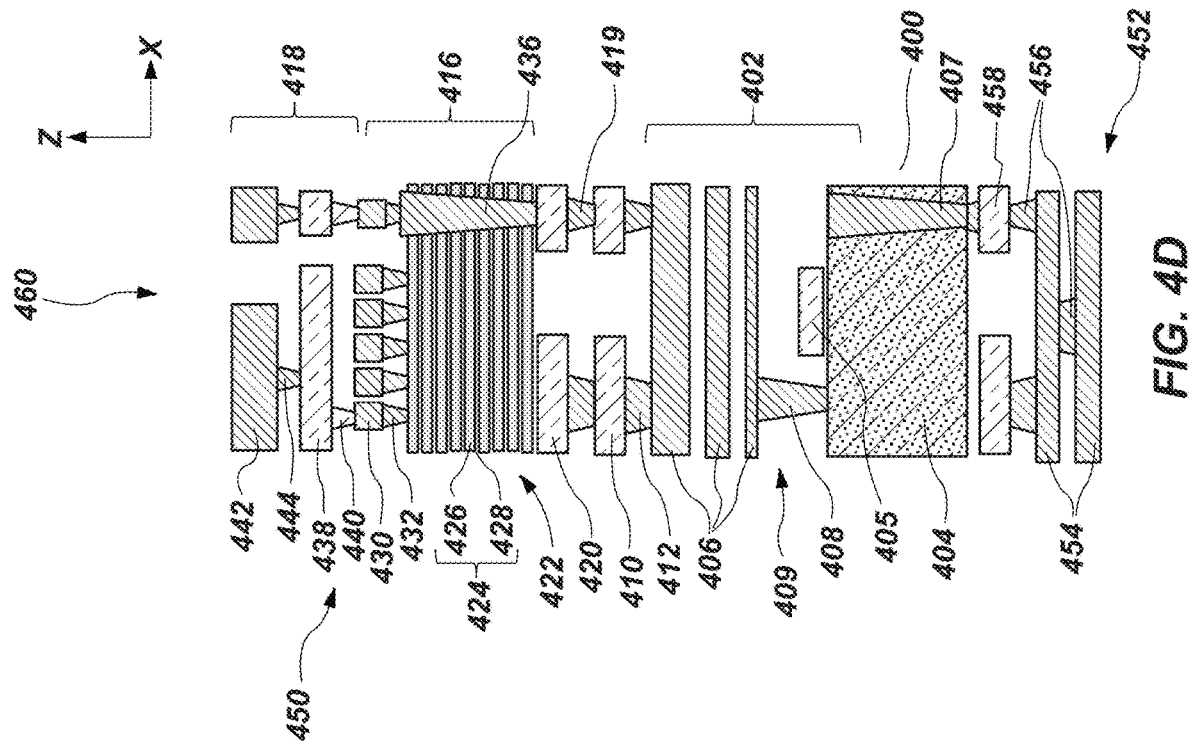

Referring next to FIG. 4C, the base structure 414 (FIG. 4B) may be removed (e.g., detached) from the second microelectronic device structure 450, and a carrier structure 446 (e.g., a carrier wafer) may be attached (e.g., bonded) to the bond pad structures 442 by way of an adhesive material 448. The carrier structure 446 and the adhesive material 448 may be configured to facilitate safe handling of the second microelectronic device structure 450 for further processing (e.g., attachment to the first microelectronic device structure 400 (FIG. 4A)), as described in further detail below. The carrier structure 446 and the adhesive material 448 may respectively comprise a conventional carrier structure (e.g., a conventional carrier wafer) and a conventional adhesive material, and are thus not described in detail herein. In addition, the base structure 414 (FIG. 4B) may be removed from the second microelectronic device structure 450 using conventional removal processes (e.g., conventional detachment processes, conventional grinding processes) and conventional equipment, which are also not described in detail herein.

Next, referring to FIG. 4D, the second microelectronic device structure 450 may be attached (e.g., bonded) to the first microelectronic device structure 400, and passive devices 452 may be formed vertically adjacent a back side (e.g., bottom side, a lower side) of the first microelectronic device structure 400 to form a microelectronic device structure assembly 460. The second microelectronic device structure 450 may be attached to the first microelectronic device structure 400 without a bond line. Thereafter, the carrier structure 446 (FIG. 4C) and the adhesive material 448 (FIG. 4C) may be removed.

As shown in FIG. 4D, the third interconnect structures 419 of the second microelectronic device structure 450 may be positioned on the first pad structures 410 of the first microelectronic device structure 400. In addition, a dielectric material (e.g., a dielectric oxide material) (omitted from FIG. 4D for clarity and ease of understanding the ease of understanding of the drawings and related description) may cover and surround the first pad structures 410, the second interconnect structures 412, the third interconnect structures 419, and the second pad structures 420, and may at least partially physically couple the second microelectronic device structure 450 to the first microelectronic device structure 400.

The passive devices 452 may include one or more of resistors, capacitors, inductors, and decoupling devices. As shown in FIG. 4D, the passive devices 452 may be electrically connected to the filled via(s) 407 (e.g., filled TSV(s)) vertically extending through the semiconductive base structure 404, and may include third routing structures 454 and fourth interconnect structures 456 operatively associated therewith. The filled via(s) 407 may be connected to one or more third pad structures 458, one or more of the of fourth interconnect structures 456 may vertically extend between and electrically couple one or more of the third pad structures 458 and one or more of the third routing structures 454, and other of the fourth interconnect structures 456 may vertically extend between and electrically couple and some of the third routing structures 454. The third pad structures 458, the third routing structures 454, and the fourth interconnect structures 456 may each individually be formed of and include conductive material.

The third pad structures 458 may, for example, be formed and connected to conductive material of the filled via(s) 407 after thinning (e.g., in the Z-direction) the semiconductive base structure 404 from a back side thereof to expose the filled via(s) 407 following attachment of the second microelectronic device structure 450 to the first microelectronic device structure 400. In additional embodiments, the filled via(s) 407 are formed in the semiconductive base structure 404 after the attachment of the second microelectronic device structure 450 to the first microelectronic device structure 400, and then the third pad structure(s) 458 are formed and connected to the conductive material of the filled via(s) 407. Thereafter, the third routing structures 454 and the fourth interconnect structures 456 may be formed in electrical communication with the third pad structure(s) 458 (and, hence, the filled via(s) 407).

After forming the microelectronic device structure assembly 460, the carrier structure 446 (FIG. 4C) and the adhesive material 448 (FIG. 4C) may be removed therefrom using conventional removal processes (e.g., conventional detachment processes, conventional grinding processes) and conventional equipment, which are not described in detail herein.

Figure 5:
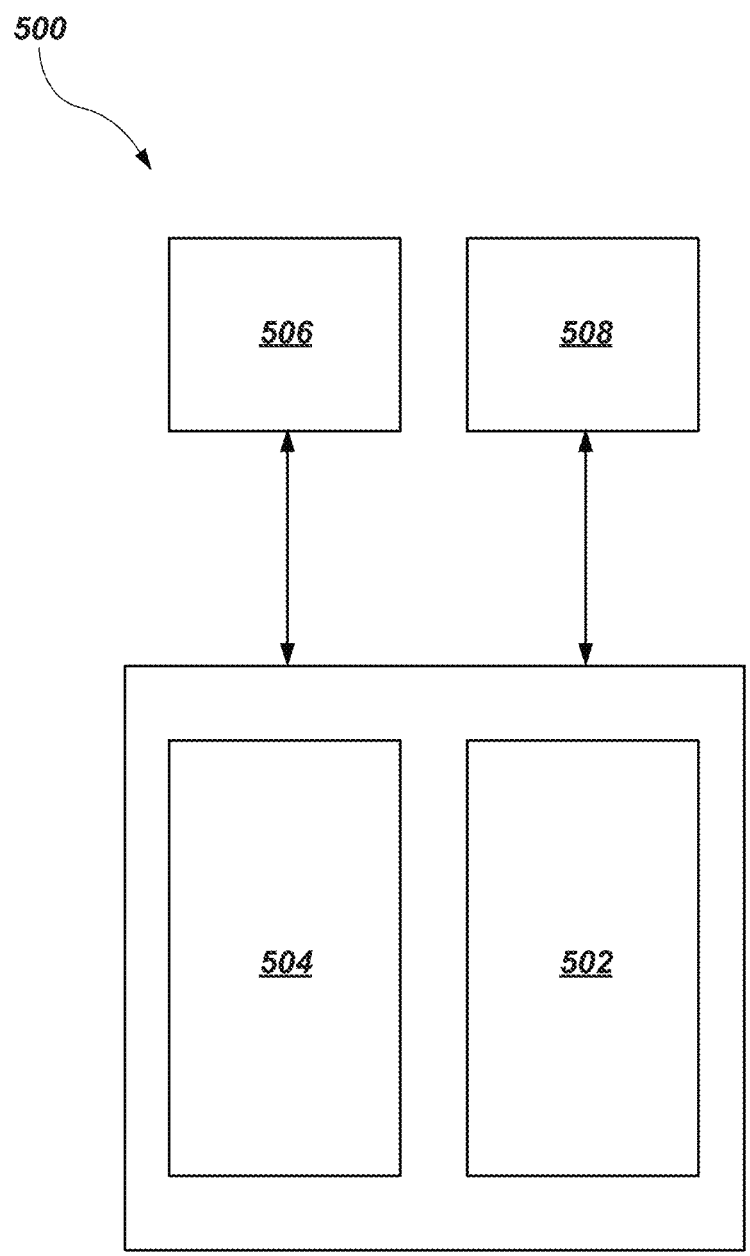
FIG. 5 is a schematic block diagram of an electronic system, in accordance with an embodiment of the disclosure.

Structures, assemblies, and devices in accordance with embodiments of the disclosure may be used in embodiments of electronic systems of the disclosure. For example, FIG. 5 is a block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may comprise, for example, an embodiment of one or more of a microelectronic device structure, a microelectronic device structure assembly, and a microelectronic device previously described herein with reference to FIGS. 1C, 1D, 2D, 3D, and 4D. The electronic system 500 may further include at least one electronic signal processor device 504 (often referred to as a "microprocessor"). The electronic signal processor device 504 may, optionally, include an embodiment of one or more of a microelectronic device structure, a microelectronic device structure assembly, and a microelectronic device previously described herein with reference to FIGS. 1C, 1D, 2D, 3D, and 4D. While the memory device 502 and the electronic signal processor device 504 are depicted as two (2) separate devices in FIG. 5, in additional embodiments, a single (e.g., only one) memory/processor device having the functionalities of the memory device 502 and the electronic signal processor device 504 is included in the electronic system 500. In such embodiments, the memory/processor device may include one or more of a microelectronic device structure, a microelectronic device structure assembly, and a microelectronic device previously described herein with reference to FIGS. 1C, 1D, 2D, 3D, and 4D. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, one or more of a monitor, a display, a printer, an audio output jack, and a speaker. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, in accordance with embodiments of the disclosure, an electronic system comprises an input device, an output device, a processor device operably coupled to the input device and the output device, and a memory device operably coupled to the processor device. The memory device comprises a stack structure, vertically extending strings of memory cells within the stack structure, control logic devices comprising CMOS circuitry underlying the stack structure, and additional control logic devices comprising additional CMOS circuitry overlying the stack structure. The stack structure comprises tiers each comprising a conductive structure and an insulative structure vertically neighboring the conductive structure. The control logic devices are configured to effectuate a portion of control operations for the vertically extending strings of memory cells. The additional control logic devices have relatively lower operational voltage requirements than the control logic devices and are configured to effectuate an additional portion of the control operations for the vertically extending strings of memory cells.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
    a memory array region comprising:
        a stack structure comprising vertically alternating conductive structures and insulating structures; and
        vertically extending strings of memory cells within the stack structure;
    a control logic region underlying the stack structure and comprising control logic devices configured to effectuate a portion of control operations for the vertically extending strings of memory cells;
    an additional control logic region overlying the stack structure and comprising additional control logic devices configured to effectuate an additional portion of the control operations for the vertically extending strings of memory cells;
    conductive pad structures underlying the stack structure and electrically connected to the control logic devices;
    additional conductive pad structures overlying the stack structure and electrically connected to the additional control logic devices; and
    at least one conductive contact structure vertically extending completely through the stack structure and electrically connected to at least one of the conductive pad structures and at least one of the additional conductive pad structures.

2. The microelectronic device of claim 1, wherein the additional control logic devices of the additional control logic region are configured to operate at applied voltages less than or equal to about 1.4 V.

3. The microelectronic device of claim 1, wherein the additional control logic devices of the additional control logic region are configured to operate at applied voltages within a range of from about 0.7V to about 1.3 V.

4. The microelectronic device of claim 1, wherein the control logic devices and the additional control logic devices each individually comprise CMOS circuitry.

5. The microelectronic device of claim 1, further comprising:
    conductive line structures vertically between the stack structure and the additional conductive pad structures;
    conductive routing structures vertically between the conductive line structures and the additional conductive pad structures; and
    interconnect structures vertically between the conductive routing structures and the additional conductive pad structures.

6. The microelectronic device of claim 5, wherein:
    the conductive routing structures comprise aluminum; and
    the interconnect structures comprise copper.

7. A microelectronic device, comprising:
    a memory array region comprising:
        a stack structure comprising vertically alternating conductive structures and insulating structures; and
        vertically extending strings of memory cells within the stack structure;
    a control logic region underlying the stack structure and comprising control logic devices configured to effectuate a portion of control operations for the vertically extending strings of memory cells;
    an additional control logic region overlying the stack structure and comprising additional control logic devices configured to effectuate an additional portion of the control operations for the vertically extending strings of memory cells; and
    an additional memory array region underlying the control logic region and comprising:
        an additional stack structure comprising vertically alternating additional conductive structures and additional insulating structures; and
        additional vertically extending strings of memory cells within the additional stack structure.

8. A method of forming a microelectronic device, comprising:
    forming a first microelectronic device structure comprising:
        a control logic region comprising control logic devices; and
        a memory array region over the control logic region and comprising:
            conductive pad structures electrically connected to the control logic devices;
            a stack structure over the conductive pad structures and comprising vertically alternating conductive structures and insulating structures;
            additional conductive pad structures overlying the stack structure;
            vertically extending strings of memory cells within the stack structure; and
            at least one conductive contact structure vertically extending completely through the stack structure and electrically connected to at least one of the conductive pad structures and at least one of the additional conductive pad structures;
    forming a second microelectronic device structure comprising an additional control logic region comprising additional control logic devices; and
    attaching the first microelectronic device structure to the second microelectronic device structure such that the stack structure vertically intervenes between the control logic region and the additional control logic region, and such that the additional conductive pad structures are electrically connected to the additional control logic devices.

9. The method of claim 8, further comprising selecting the additional control logic devices to comprise CMOS circuitry configured to operate at applied voltages within a range of from about 0.7 V to about 1.4 V.

10. The method of claim 9, further comprising selecting the control logic devices to comprise additional CMOS circuitry configured to operate at other applied voltages greater than the applied voltages effective to operate of the CMOS circuitry of the additional control logic devices.

11. A method of forming a microelectronic device, comprising:
forming a first microelectronic device structure comprising:
a control logic region comprising control logic devices; and
a memory array region over the control logic region and comprising:
a stack structure comprising vertically alternating conductive structures and insulating structures; and
vertically extending strings of memory cells within the stack structure;
forming a second microelectronic device structure comprising an additional control logic region comprising additional control logic devices;
attaching the first microelectronic device structure to the second microelectronic device structure such that the stack structure vertically intervenes between the control logic region and the additional control logic region;
forming a third microelectronic device structure comprising:
a further control logic region comprising further control logic devices; and
an additional memory array region over the further control logic region and comprising:
an additional stack structure comprising vertically alternating additional conductive structures and additional insulating structures; and
additional vertically extending strings of memory cells within the additional stack structure; and
attaching the third microelectronic device structure to the first microelectronic device structure such that the additional stack structure vertically underlies the stack structure.

\* \* \* \* \*

UNITED STATES PATENT AND TRADEMARK OFFICE
CERTIFICATE OF CORRECTION

PATENT NO. : 11,282,815 B2
APPLICATION NO. : 16/742485
DATED : March 22, 2022
INVENTOR(S) : Kunal R. Parekh, Paolo Tessariol and Akira Goda It is certified that error appears in the above-identified patent and that said Letters Patent is hereby corrected as shown below:

In the Specification
Column 3, Line 24, change "e.g.," to -- (e.g., --

Signed and Sealed this
Tenth Day of May, 2022

Katherine Kelly Vidal
*Director of the United States Patent and Trademark Office*